(12) United States Patent
Hayakawa

(10) Patent No.: US 12,087,364 B2
(45) Date of Patent: Sep. 10, 2024

(54) SEMICONDUCTOR DEVICE WITH A MEMORY CAPABLE OF BATCH ERASING A PLURALITY OF SECTORS AND METHOD OF MANUFACTURING THE SAME

(71) Applicant: RENESAS ELECTRONICS CORPORATION, Tokyo (JP)

(72) Inventor: Masafumi Hayakawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/547,856

(22) Filed: Dec. 10, 2021

(65) Prior Publication Data

US 2022/0208275 A1 Jun. 30, 2022

(30) Foreign Application Priority Data

Dec. 25, 2020 (JP) .................................. 2020-216102

(51) Int. Cl.
  *G11C 16/16* (2006.01)
  *G11C 16/08* (2006.01)
  *G11C 16/34* (2006.01)

(52) U.S. Cl.
  CPC .............. *G11C 16/16* (2013.01); *G11C 16/08* (2013.01); *G11C 16/3445* (2013.01)

(58) Field of Classification Search
  CPC .............. G11C 16/3436; G11C 16/344; G11C 16/3445; G11C 16/345; G11C 16/14; G11C 16/16; G11C 16/08; G11C 16/3404
  See application file for complete search history.

(56) References Cited

U.S. PATENT DOCUMENTS

| 6,421,276 B1* | 7/2002 | Goltman | G11C 16/0475 365/185.29 |
| 6,760,259 B1 | 7/2004 | Futatsuya et al. | |
| 7,783,824 B2* | 8/2010 | Nakazawa | G11C 16/344 711/170 |
| 2015/0221388 A1* | 8/2015 | Lee | G11C 16/16 365/185.11 |

FOREIGN PATENT DOCUMENTS

JP 2008-293654 A 12/2008

* cited by examiner

*Primary Examiner* — Donald H B Braswell
(74) *Attorney, Agent, or Firm* — Rimon P.C.

(57) ABSTRACT

A semiconductor device includes a flash memory including a plurality of electrically erasable memory cells and configured to output a verification result signal indicating whether erasing is succeeded or not, and a control block configured to control the flash memory. The control block includes a batch erasing range control circuit indicating a collectively erased range in the flash memory. When the verification result signal VR indicates failure of erasing of sectors in a first range specified by the batch erasing range control circuit after the erasing is executed, a second range for which erasing is to be executed again is calculated on the basis of a failure sector address that specifies a sector for which the erasing is failed and an end sector address that specifies an end of the first range, the specified second range is set to the batch erasing range control circuit, and erasing sectors in the second range is executed.

2 Claims, 22 Drawing Sheets

SEMICONDUCTOR DEVICE WITH A MEMORY CAPABLE OF BATCH ERASING A PLURALITY OF SECTORS AND METHOD OF MANUFACTURING THE SAME

CROSS-REFERENCE TO RELATED APPLICATIONS

The disclosure of Japanese Patent Application No. 2020-216102 filed on Dec. 25, 2020 including the specification, drawings and abstract is incorporated herein by reference in its entirety.

BACKGROUND

The present invention relates to a semiconductor device and a control method thereof. In particular, the present invention relates to a semiconductor device provided with a memory capable of collectively erasing (or batch erasing) a plurality of sectors by using a predetermined number of electrically erasable memory cells as one sector and a control method thereof, for example.

Patent document 1 describes, as a flash memory, a batch erasable memory provided with a plurality of electrically erasable memory cells, for example. Further, Patent document 1 describes a batch erasing operation for collectively erasing a plurality of basic memory blocks each having a plurality of memory cells.

There are disclosed techniques listed below.
[Patent Document 1] Japanese Unexamined Patent Application Publication No. 2008-293654

SUMMARY

The basic memory block (hereinafter, referred to also as a "block") described in Patent document 1 is composed of a predetermined number of electrically erasable memory cells, for example, and a plurality of blocks is to be erased collectively. In this case, a range to be erased (erasing range: for example, the number of consecutive blocks) is determined at the start of the batch erasing operation, and it is not considered that the erasing range is changed during the erasing operation.

In a memory such as a flash memory, an erasing operation is composed of an erasing operation of changing a threshold value of a memory cell into a predetermined value (hereinafter, referred to also as an "erasing/writing operation") and a verification operation of confirming whether the threshold value of the memory cell is changed into the predetermined value in the erasing/writing operation or not, that is, whether erasing is succeeded or not. For that reason, hereinafter, the erasing operation is also referred to as an erasing verification operation.

When a plurality of blocks is subjected to batch erasing and a block for which erasing is not succeeded (that is, failed) is confirmed by the verification operation, the erasing verification operation is executed for the erasing range determined at the time of start of the batch erasing operation. For that reason, there is a problem that an erasing verification time becomes long. Patent document 1 does not describe and recognize such a problem.

An outline of representative one of embodiments disclosed in the present application will briefly be explained as follows.

Namely, a semiconductor device according to a representative embodiment includes: a memory provided with a plurality of electrically erasable memory cells and configured to output a verification result signal indicating whether erasing is succeeded or not; and a control block configured to control the memory. Here, the control block includes a batch erasing range control circuit indicating a range to be collectively erased in the memory. When the verification result signal indicates failure of erasing of sectors in a first range specified by the batch erasing range control circuit after the erasing is executed, a second range for which erasing is to be executed again is specified on a basis of a failure sector address that specifies a sector for which the erasing is failed and an end sector address that specifies an end of the first range, and the specified second range is set to the batch erasing range control circuit, and erasing sectors in the second range is executed.

The other object and new feature will become apparent from description of the present specification and the accompanying drawings.

According to one embodiment, it is possible to provide a semiconductor device provided with a memory capable of shortening a time of an erasing operation.

DETAILED DESCRIPTION

Figure 1:
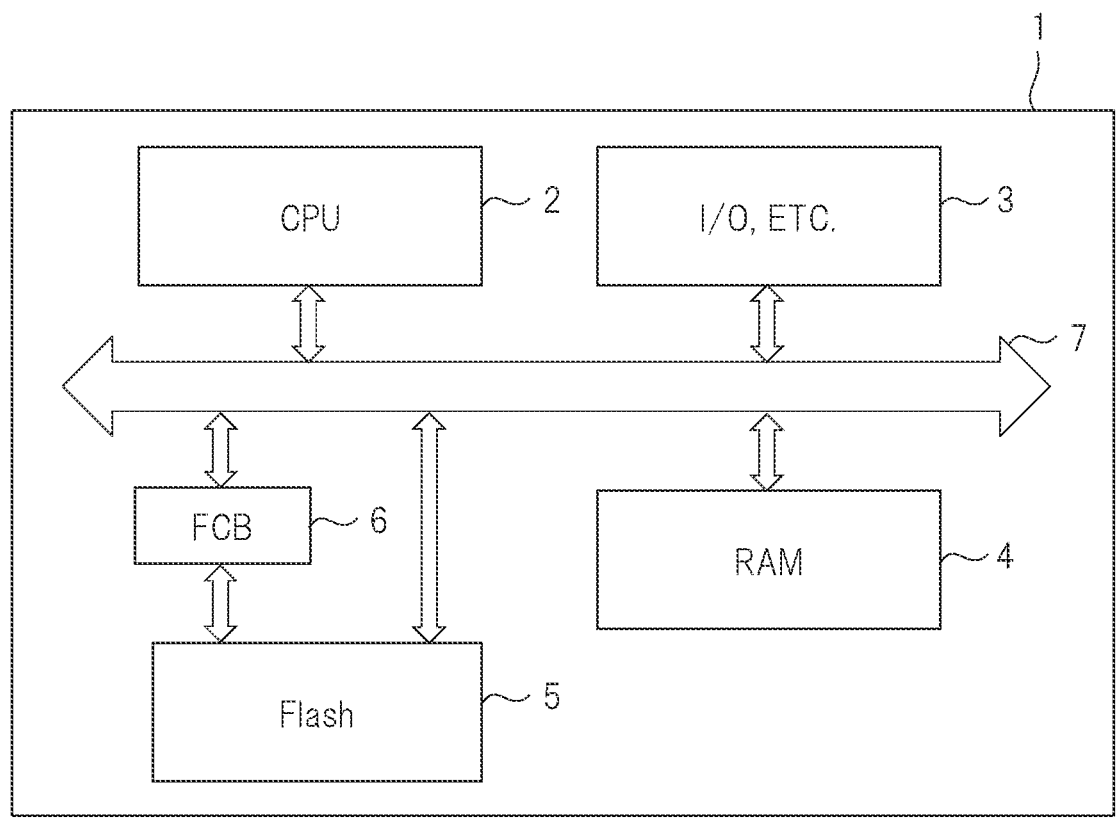
FIG. 1 is a block diagram illustrating a configuration of a semiconductor device according to a first embodiment.

Hereinafter, respective embodiments according to the present invention will be described with reference to the drawings. Note that the disclosure is just one example, and suitable modifications that can be easily conceived by a person skilled in the art without departing from the spirit of the present invention are included within the scope of the present invention as a matter of course.

Further, in this specification and the respective drawings, the same reference numerals are respectively assigned to the similar components described in the drawings, which have already been described. Detailed description thereof may be omitted appropriately.

First Embodiment

In the following description, a semiconductor device provided with a flash memory as a memory will be described as an example. Further, a sector in the flash memory as a block to be erased by a batch erasing operation will be described as an example. One sector is composed of an electrically rewritable memory cell with 512 Bytes, for example. For example, in a case where the memory cell is a memory cell for storing binary data and one bit is 8 bits, one sector is composed of 512×8 memory cells. Of course, the number of memory cells constituting the sector is not limited to this. Further, the sector is merely one example, and the block is not limited to the sector.

Before explaining a semiconductor device according to a first embodiment, problems found by inventor(s) of the present application will be described with reference to the drawings.

<Explanation of Problems>

Figure 21B:
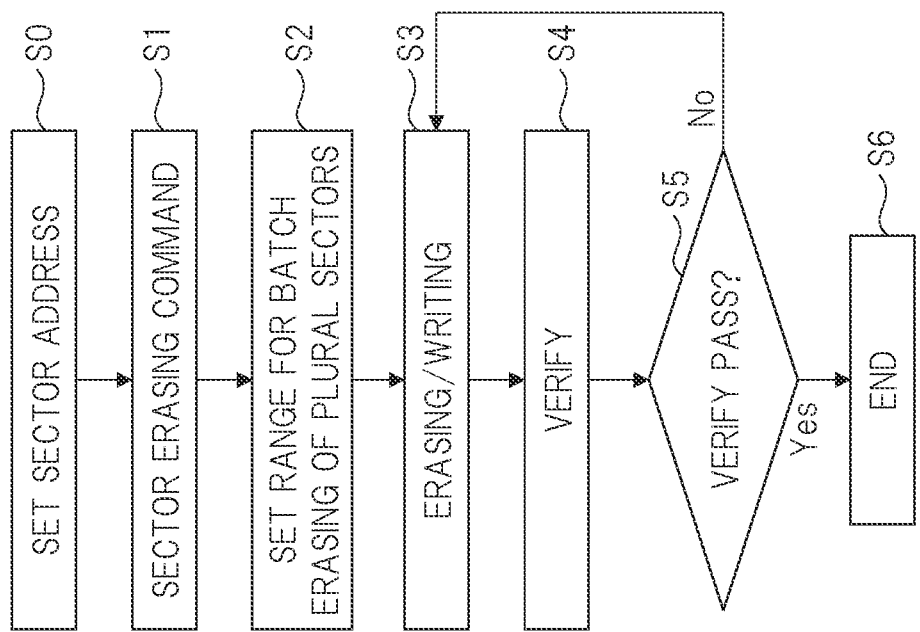
FIGS. 21A and 21B are views for explaining problems.
Figure 21A:
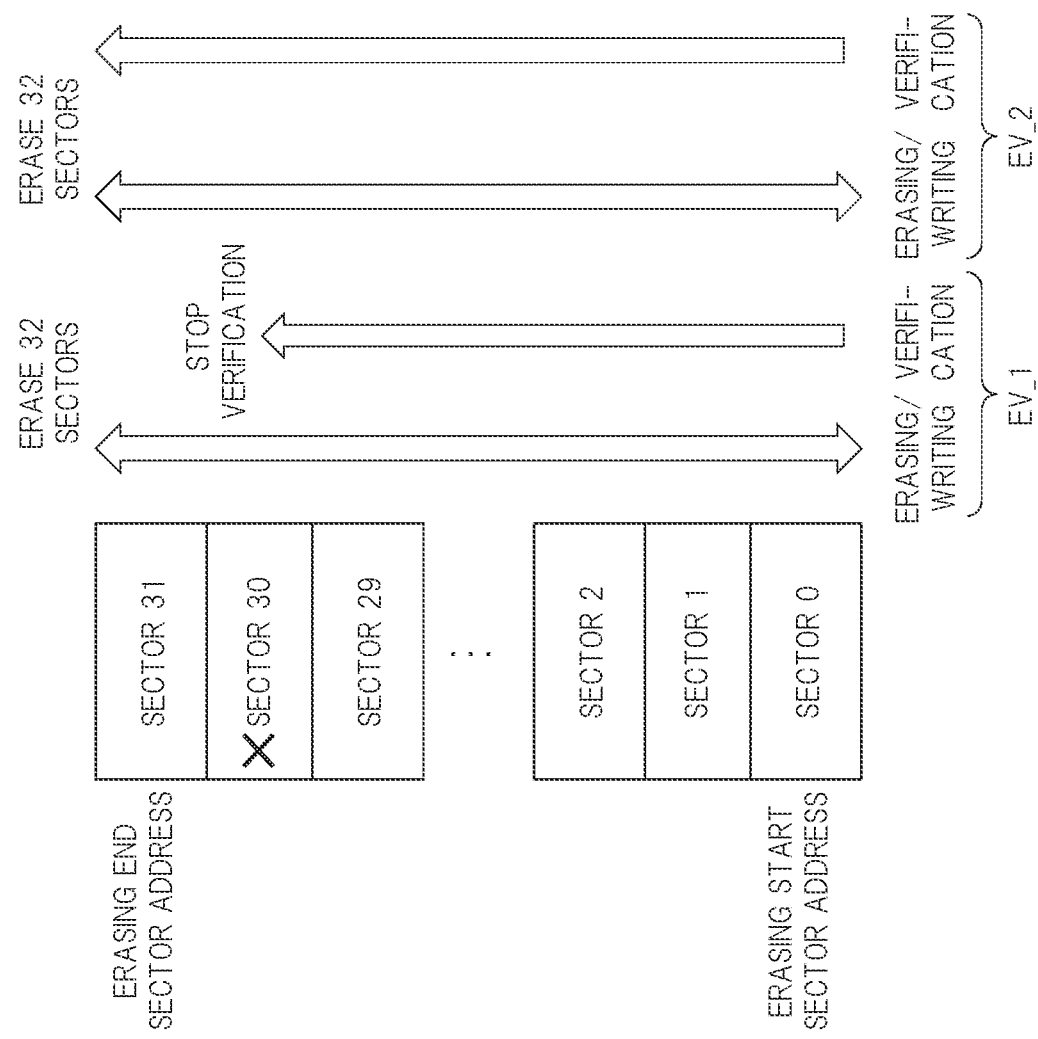
Figure 22:
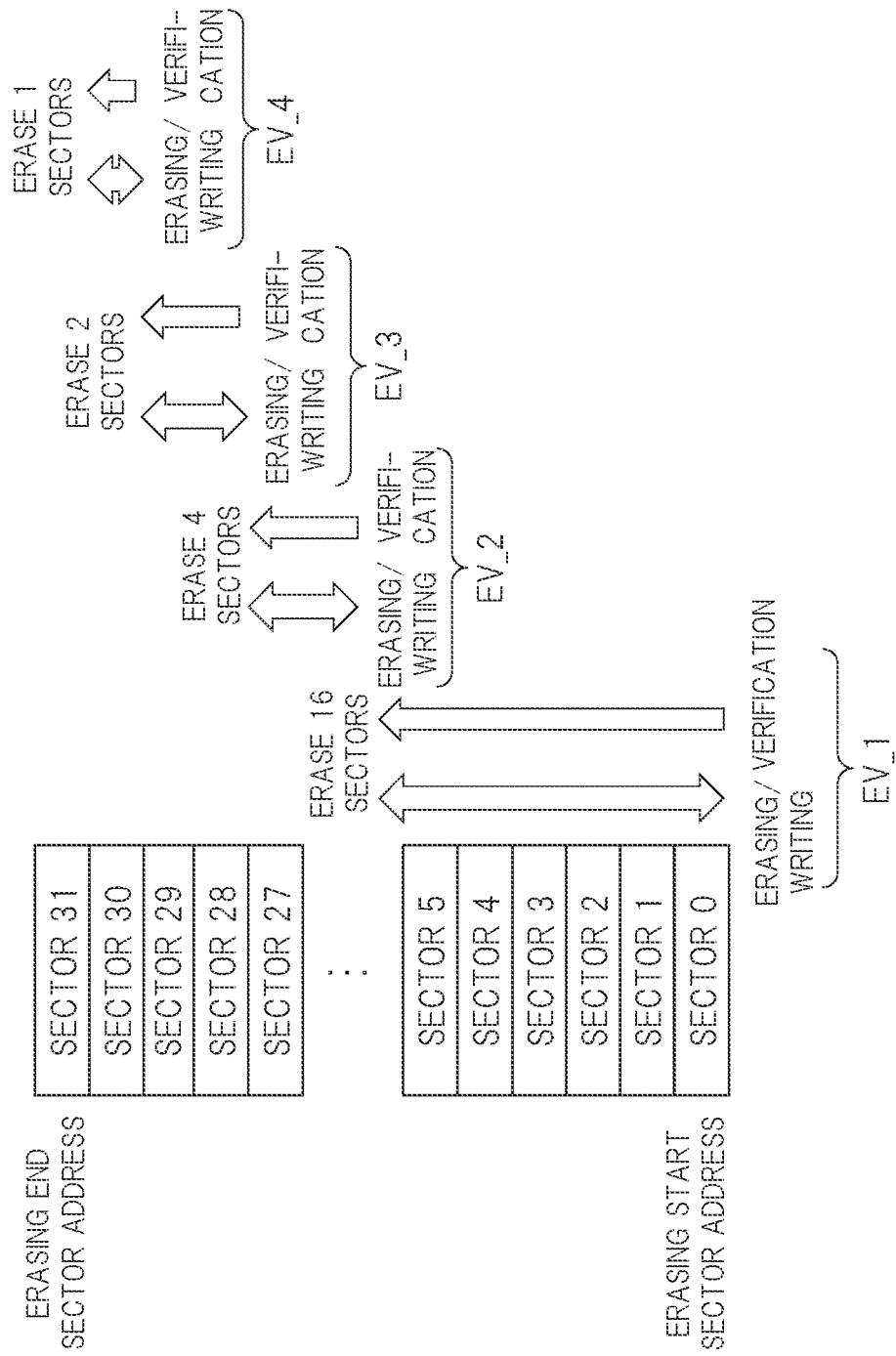
FIG. 22 is a view for explaining the problems.

FIG. 21 and FIG. 22 are views for explaining problems of the present application. Here, FIG. 21A is a schematic view for explaining a batch erasing operation, and FIG. 21B is a flowchart diagram of the batch erasing operation.

FIG. 21 illustrates a case where a memory includes more than 32 sectors, and as illustrated in FIG. 21A, illustrates a case where 32 consecutive sectors of a sector 0 to a sector 31 is subjected to batch erasing. Further, FIG. 21 illustrates, as an example, a case where erasing is failed in the sector 30. Sector addresses are respectively assigned to the sector 0 to the sector 31. A start sector address specifies the sector 0, and an end sector address specifies the sector 31.

As illustrated in FIG. 21B, at Step S0, sector addresses for specifying a plurality of sectors to be erased are set. Here, a start sector address and an end sector address are set. Next, a sector erasing command is issued at Step S1. At Step S2, a range for batch erasing of a plurality of sector is set. Namely, a range represented by the start sector address and the end sector address set at Step S0 is set as a batch erasing range.

At Step S3, an erasing/writing operation is executed; at Step S4, a verification operation is executed; and at Step S5, determination of whether erasing is succeeded or not (verify pass?) is executed. In a case where it is determined at Step S5 that the erasing is succeeded, the batch erasing operation is terminated at Step S6. In a case where the erasing is failed, the processing flow returns to Step S3, and the processes at Steps S3 to S5 are executed again. Namely, at Steps S3 to S5, an erasing verification operation configured by the erasing/writing operation and the subsequent verification operation is executed again.

In FIG. 21A, a reference numeral EV_1 denotes a first round of erasing verification operation, and a reference numeral EV_2 denotes a second round of erasing verification operation. By the erasing/writing operation in the erasing verification operation EV_1, erasing for the sector 0 to the sector 31 is executed. By the verification operation, it is confirmed whether erasing for each sector is succeeded or not. In the example of FIG. 21A, it is confirmed that the erasing is failed in the sector 30, and the verification operation is stopped. Namely, it is determined as No at Step S5 of FIG. 21B. As a result, the process at Step S3 is executed again, and the erasing verification operation EV_2 is started. In the erasing verification operation EV_2, erasing for the sector 0 to the sector 31 is executed by the erasing/writing operation, and the verification operation is then executed. In the example illustrated in FIG. 21A, by the verification operation in the second round of the erasing verification operation EV_2, it is confirmed that the erasing for each sector from the sector 0 to the sector 31 is succeeded, and the batch erasing operation is terminated.

Thus, even though the erasing for the sector 0 to the sector 29 is succeeded in the first round of the erasing verification operation EV_1, the erasing verification operation EV_2 for the sector 0 to the sector 31 is executed again. Therefore, there is a problem that an erasing time becomes long. Further, since the erasing/writing operation is executed for the sector 0 to the sector 29 twice, there is a fear that the number of times of erasing increases to accelerate deterioration of characteristics of the memory cell.

In FIG. 21, the batch erasing range is a range specified by sector addresses of a power of 2. Namely, the end sector address was represented by the power of 2. It is desirable that the batch erasing range is represented by the power of 2. However, if the end sector address is not represented by the power of 2, for example, the end sector address specifies the sector 30, as illustrated in FIG. 22, the erasing verification operation is executed while switching an erasing range. Namely, an erasing/writing operation and a verification operation are executed for 16 sectors by an erasing verification operation EV_1, and the erasing/writing operation and the verification operation are executed for four sectors by an erasing verification operation EV_2. Then, the erasing/writing operation and the verification operation are executed for two sectors by an erasing verification operation EV_3, and the erasing/writing operation and the verification operation are executed for one sector by an erasing verification operation EV_4. In this case, even though failure of erasing is not confirmed, the number of times of the erasing verification operation increases, whereby there is a problem that the erasing time becomes long.

<Configuration of Semiconductor Device According to First Embodiment>

FIG. 1 is a block diagram illustrating a configuration of a semiconductor device according to the first embodiment. In FIG. 1, a reference numeral 1 denotes a semiconductor device. In the first embodiment, for example, the semiconductor device 1 is composed of a microcontroller. The semiconductor device (microcontroller) 1 includes various circuit blocks and the like, but FIG. 1 illustrates circuit blocks necessary for the following explanation. In FIG. 1, a reference numeral 2 denotes a processor (CPU), a reference numeral 3 denotes an input/output block (I/O) and the like, and a reference numeral 4 denotes a volatile memory (RAM). Further, a reference numeral 5 denotes a flash memory (Flash) provided with a plurality of memory cells that can be erased and written electrically, and a reference numeral 6 denotes a control block (FCB) configured to control the flash memory 5.

Each of the processor 2, the input/output block 3, the volatile memory 4, the flash memory 5, and the control block 6 is connected to a bus 7, and data are transmitted and received between them. Data to be written are supplied from the processor 2 to the flash memory 5 via the bus 7, for example, and data read out from the flash memory 5 are supplied to the processor 2 via the bus 7, for example. A command from the processor 2 (for example, the sector erasing command) is supplied to the control block 6, and the control block 6 controls the flash memory 5 in accordance with the supplied command, whereby writing and erasing to and from the flash memory 5 are realized.

<<Configuration of Control Block>>

Figure 2:
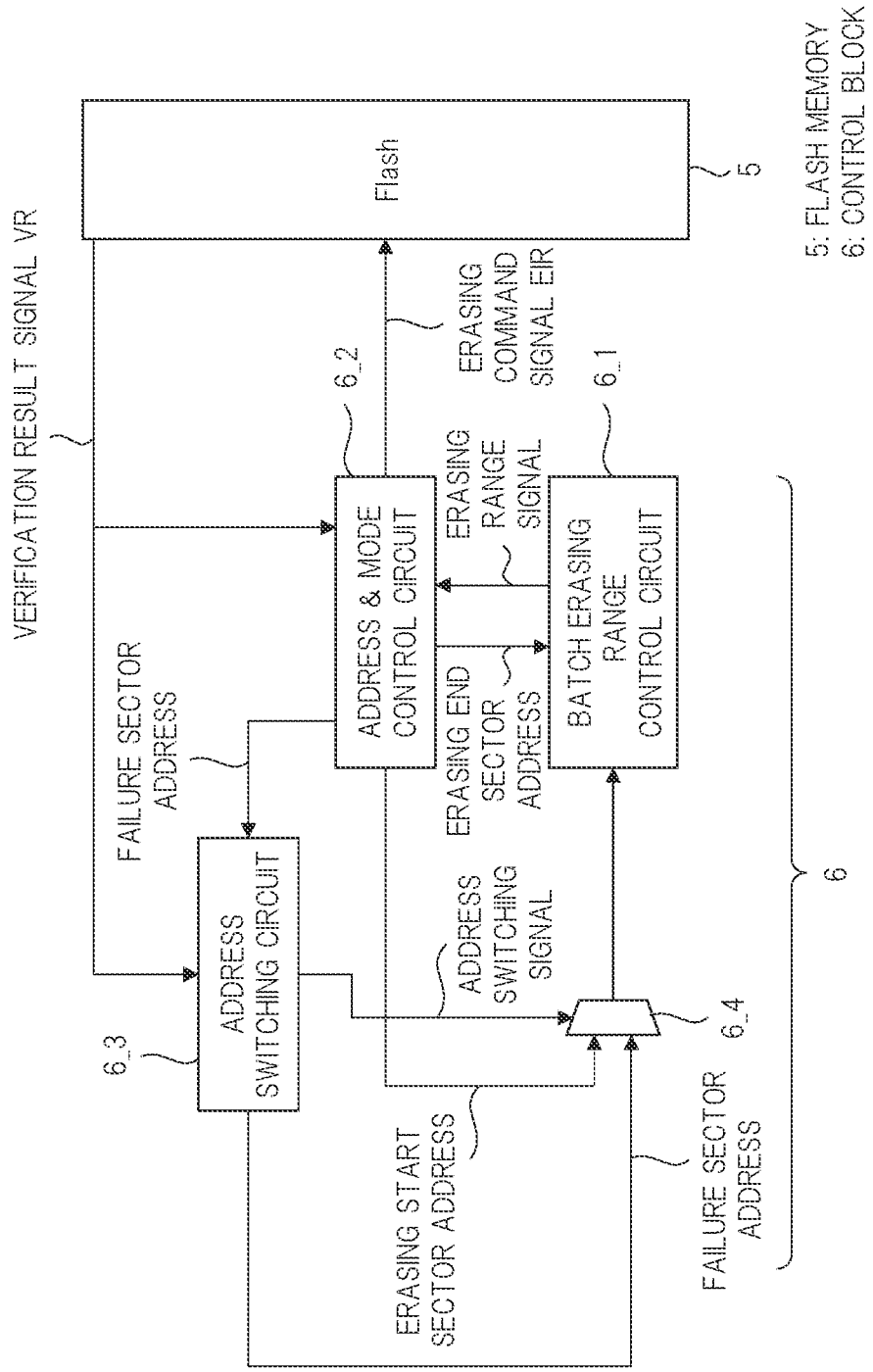
FIG. 2 is a block diagram illustrating a configuration of a control block according to the first embodiment.

FIG. 2 is a block diagram illustrating a configuration of the control block according to the first embodiment. The control block 6 includes a plurality of circuit blocks in order to control the flash memory 5. However, FIG. 2 illustrates only circuit blocks regarding erasing, which are necessary for the following explanation. Further, in order to explain signals to be transmitted and received between the flash memory 5 and the control block 6, FIG. 2 also illustrates the flash memory 5.

The flash memory 5 includes a plurality of memory cells (not illustrated in the drawings) and a control circuit (not illustrated in the drawings). When an erasing command signal EIR is supplied from the control block 6, the control circuit executes an erasing verification operation for a sector that is specified by a sector address indicated by the erasing command signal EIR. As described above, the erasing verification operation includes an erasing/writing operation and a verification operation. The control circuit supplies a result of the verification operation to the control block 6 as a verification (Verify) result signal VR.

Next, a configuration of the control block 6 will be described. The control block 6 includes a batch erasing range control circuit 6_1, an address & mode control circuit 6_2, an address switching circuit 6_3, and a selector 6_4.

An erasing end sector address is supplied from the address & mode control circuit 6_2 to the batch erasing range control circuit 6_1. Further, a selector address selected by the selector 6_4 is also supplied to the batch erasing range control circuit 6_1. The batch erasing range control circuit 6_1 stores, as a range for batch erasing, a range of sector addresses specified by the erasing end sector address and the sector address from the selector 6_4, and supplies the range to the address & mode control circuit 6_2 as an erasing range signal.

The processor 2 supplies an erasing start sector address and the erasing end sector address, which specify the range for the batch erasing, to the address & mode control circuit 6_2. The address & mode control circuit 6_2 supplies this erasing start sector address to the selector 6_4, and supplies the erasing end sector address to the batch erasing range control circuit 6_1.

The verification result signal VR is supplied to the address & mode control circuit 6_2. In a case where the verification result signal VR indicates failure of erasing, the address & mode control circuit 6_2 supplies a sector address, which specifies a sector for which erasing is failed, to the address switching circuit 6_3 as a failure sector address. Further, the address & mode control circuit 6_2 supplies the erasing command signal EIR to the flash memory 5. The erasing command signal EIR is used for instructing execution of batch erasing for the range of sectors indicated by the erasing range signal supplied from the batch erasing range control circuit 6_1.

The verification result signal VR is supplied from the flash memory 5 to the address switching circuit 6_3. In a case where the verification result signal VR indicates that the erasing has failed, the address switching circuit 6_3 supplies the failure sector address, which is supplied from the address & mode control circuit 6_2, to the selector 6_4, and outputs an address switching signal (that is, a selection signal) to the selector 6_4. In response to this address switching signal, the selector 6_4 supplies the failure sector address to the batch erasing range control circuit 6_1 instead of the erase start selector address.

<<Batch Erasing Operation>>

Figure 3:
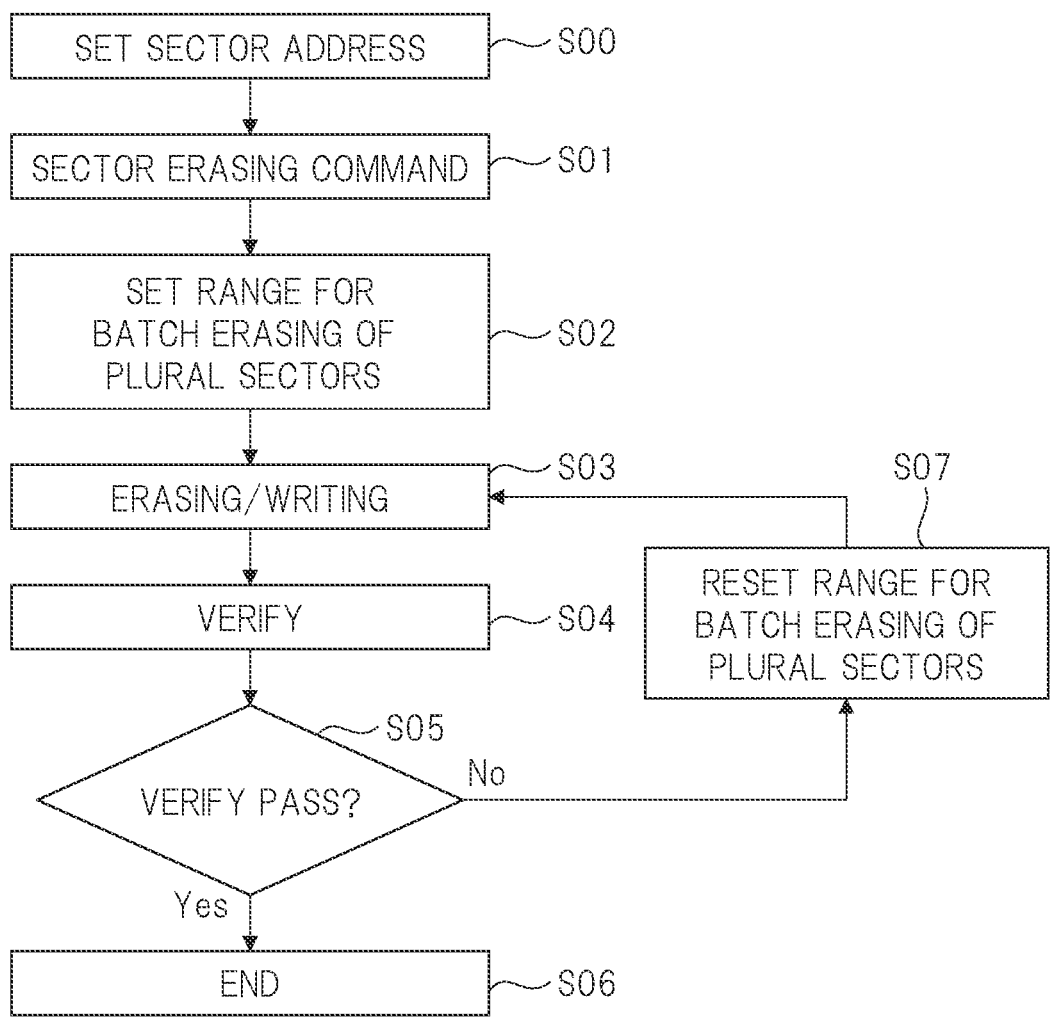
FIG. 3 is a flowchart diagram for explaining an operation of batch erasing according to the first embodiment.

Next, an operation when a sector erasing command for instructing batch erasing is supplied from the processor 2 to the control block 6 will be described with reference to the drawings. FIG. 3 is a flowchart diagram for explaining an operation of batch erasing according to the first embodiment. Further, FIG. 4 to FIG. 8 are views for schematically explaining the operation of the batch erasing according to first embodiment.

In FIG. 3, at Step 300, the processor 2 (see FIG. 1) sets an erasing start sector address and an erasing end sector address, which specify an erasing range for batch erasing, to the address & mode control circuit 6_2. At Step S01, the processor 2 issues a sector erasing command (that is, a sector batch erasing command) to the control block 6. By issuing the sector erasing command, at Step S02, the address & mode control circuit 6_2 supplies the set erasing end sector address to the batch erasing range control circuit 6_1, and supplies the erasing start sector address to the batch erasing range control circuit 6_1 via the selector 6_4. As a result, a plurality of sectors including a range specified by the erasing start sector address and the erasing end sector address is set to (or stored in) the batch erasing range control circuit 6_1 as a batch erasing range (that is, a first range), and the set batch erasing range is outputted to the address & mode control circuit 6_2 as an erasing range signal.

Next, at Step S03, the address & mode control circuit 6_2 operates as a mode of an erasing/writing operation. Namely, the address & mode control circuit 6_2 supplies an erasing command signal EIR, which instructs to erase the plurality of sectors specified by the erasing range signal, to the flash memory 5.

Figure 4:
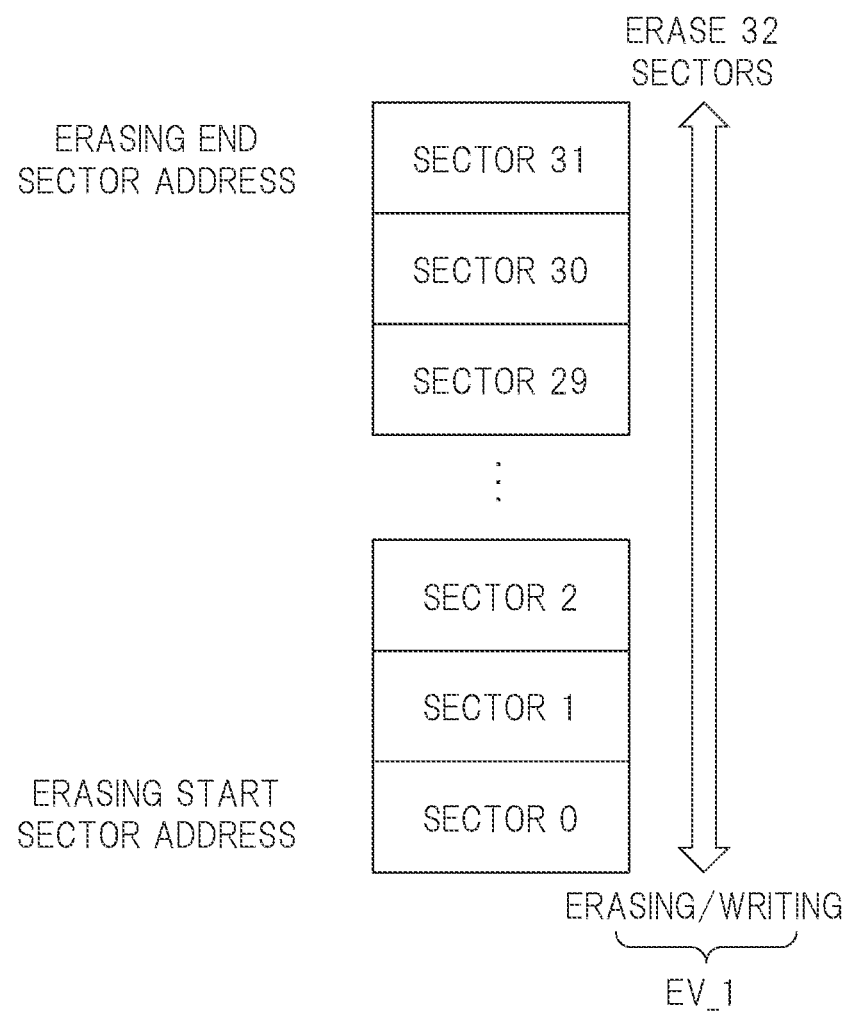
FIG. 4 is a view for schematically explaining the operation of the batch erasing according to the first embodiment.

FIG. 4 schematically illustrates an operation of erasing at Step S03. FIG. 4 illustrates a case where the batch erasing range is from the sector 0 to the sector 31. Here, the erasing start sector address specifies the sector 0, and the erasing end sector address specifies the sector 31. Although it is not limited particularly, the address & mode control circuit 6_2 outputs an erasing instruction for instructing erasing of sectors and sector addresses for specifying the sectors to be erased as the erasing command signal EIR. Namely, at Step S03, the address & mode control circuit 6_2 outputs the erasing command signal EIR for executing erasing while continuously updating a sector address from the erasing start sector address to the erasing end sector address. As a result, in the flash memory 5, as illustrated in FIG. 4, the erasing/writing operation is executed for the sector 0 to the sector 31, whereby 32 consecutive sectors are erased.

Figure 5:
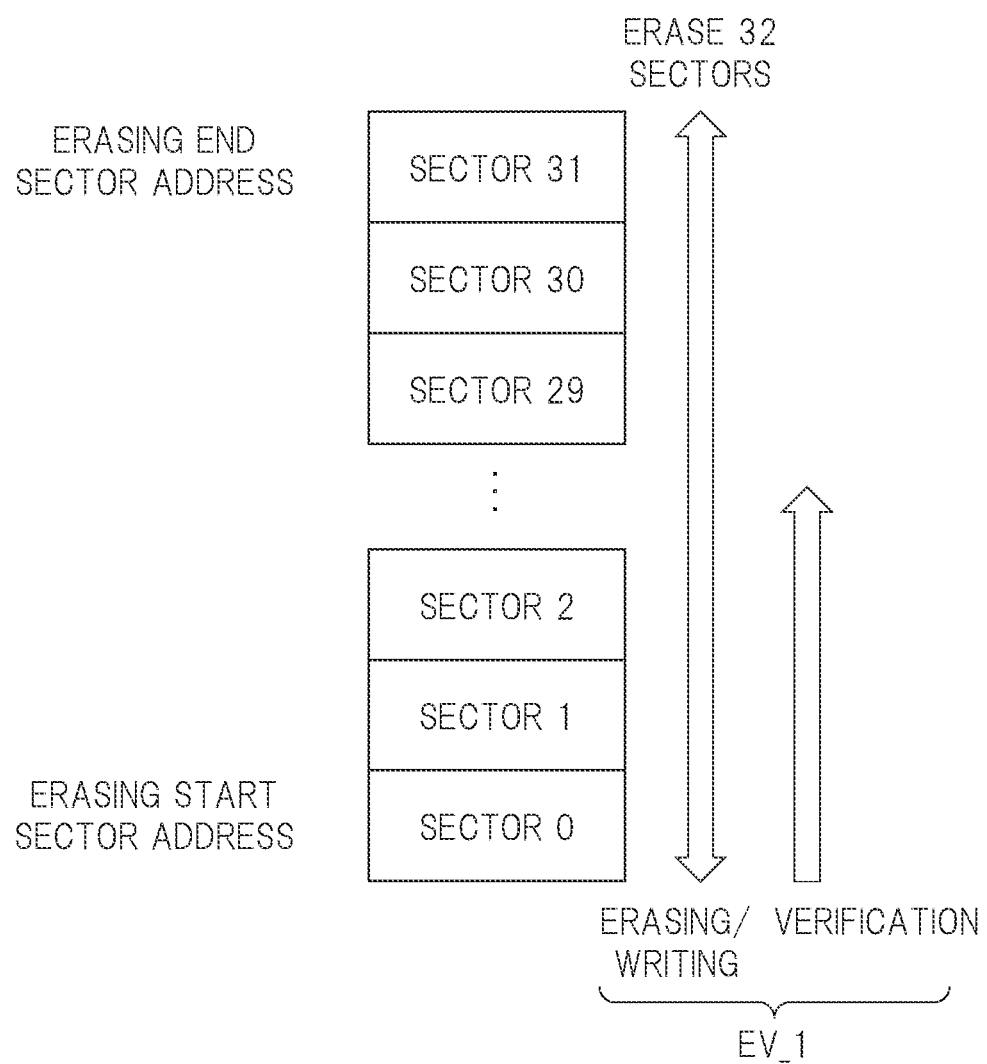
FIG. 5 is a view for schematically explaining the operation of the batch erasing according to the first embodiment.

Returning to FIG. 3, next to Step S03, a process at Step S04 is executed. At Step S04, a verification operation is executed. Namely, at Step S04, the address & mode control circuit 6_2 operates as a mode of the verification operation. In the mode of the verification operation, the address & mode control circuit 6_2 outputs, as the erasing command signal EIR, an instruction for executing the verification operation while continuously updating the sector address from the erasing start sector address to the erasing end sector address. When the instruction of the verification operation is received, the flash memory 5 executes the verification operation for the sectors specified by the sector addresses, which are supplied at that time. Namely, the flash memory 5 determines whether a threshold value of each of a memory cell included in the specified sectors becomes a predetermined value or not. In a case where it is determined that the threshold value becomes the predetermined threshold value, the flash memory 5 outputs a verification result signal VR indicating that the erasing is succeeded. On the other hand, in a case where it is determined that the threshold value does not become the predetermined threshold value, the flash memory 5 outputs a verification result signal VR indicating that the erasing is failed. FIG. 5 schematically illustrates a state where the verification operation is being executed. As illustrated in FIG. 5, the verification operation is in turn executed from the sector 0 toward the sector 31.

Every time the verification operation for one sector is completed, a process at Step S05 illustrated in FIG. 3 is executed. At Step S05, the address & mode control circuit 6_2 determines whether the verification result signal VR indicates failure of erasing or not. In a case where it is determined that the verification result signal VR indicates success of erasing, the address & mode control circuit 6_2 updates the sector address, and outputs the erasing command signal EIR for instructing the verification operation. In a case where the updated sector address reaches the erasing end sector address and the verification result signal VR at Step S05 for the sector 31 specified by the erasing end sector address indicates that erasing is succeeded, the address & mode control circuit 6_2 executes a process at Step S06. At Step S06, the batch erasing operation for the erasing range from the sector 0 to the sector 31 is terminated.

Figure 6:
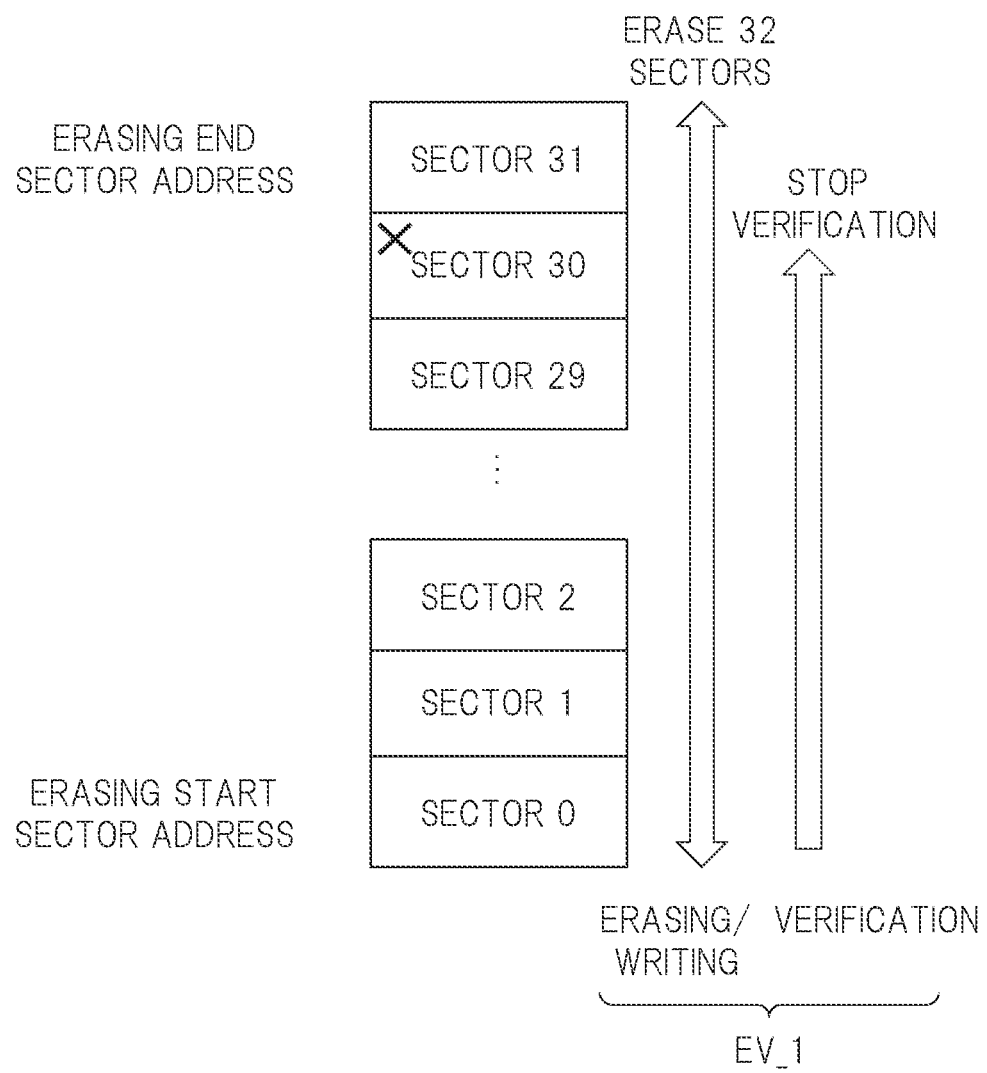
FIG. 6 is a view for schematically explaining the operation of the batch erasing according to the first embodiment.

On the other hand, in a case where the verification result signal VR indicates that the erasing is failed at Step S05, the address & mode control circuit 6_2 stops the verification operation. Namely, the address & mode control circuit 6_2 stops updating the sector address, and stops the instruction of the verification operation. FIG. 6 schematically illustrates a state where erasing is failed in the sector 30. In FIG. 6, a mark "x" attached to the sector 30 indicates the failure of the erasing. The failure of the erasing is notified to the address & mode control circuit 6_2 by the verification result signal VR. When this notification of the failure of the erasing is received, the address & mode control circuit 6_2 outputs the sector address at that time to the address switching circuit 6_3 as a failure sector address for specifying the sector in which the erasing is failed. Further, next to Step S05, a process at Step 307 is executed instead of the process at Step S06.

At Step S07, since the verification result signal VR indicates that the erasing is failed, the address switching circuit 6_3 supplies the failure sector address outputted from the address & mode control circuit 6_2 to the selector 6_4. At this time, the address switching circuit 6_3 controls the selector 6_4 by an address switching signal so that the selector 6_4 selects the failure sector address. As a result, the failure sector address is supplied to the batch erasing range control circuit 6_1 from the selector 6_4 as a sector address, a range specified by the failure sector address and the erasing end sector address (that is, a second range) is stored and reset as the erasing range.

Figure 7:
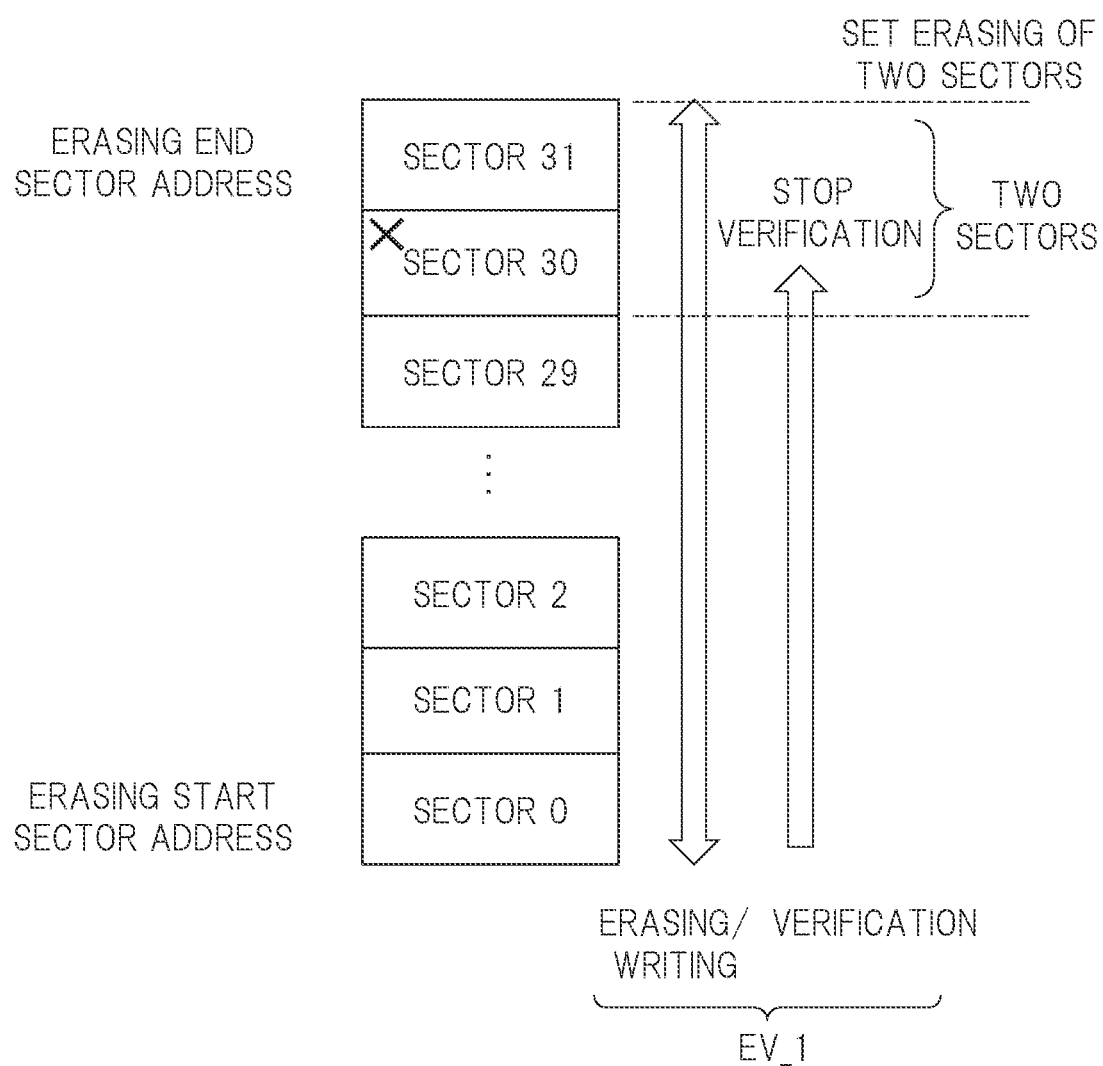
FIG. 7 is a view for schematically explaining the operation of the batch erasing according to the first embodiment.

FIG. 7 schematically illustrates a state at the time of the process at Step S07. Since the erasing is failed in the sector 30, two sectors including the sector 30 specified by the failure sector address and the sector 31 specified by the erasing end sector address is reset to the batch erasing range control circuit 6_1 as the erasing range.

Figure 8:
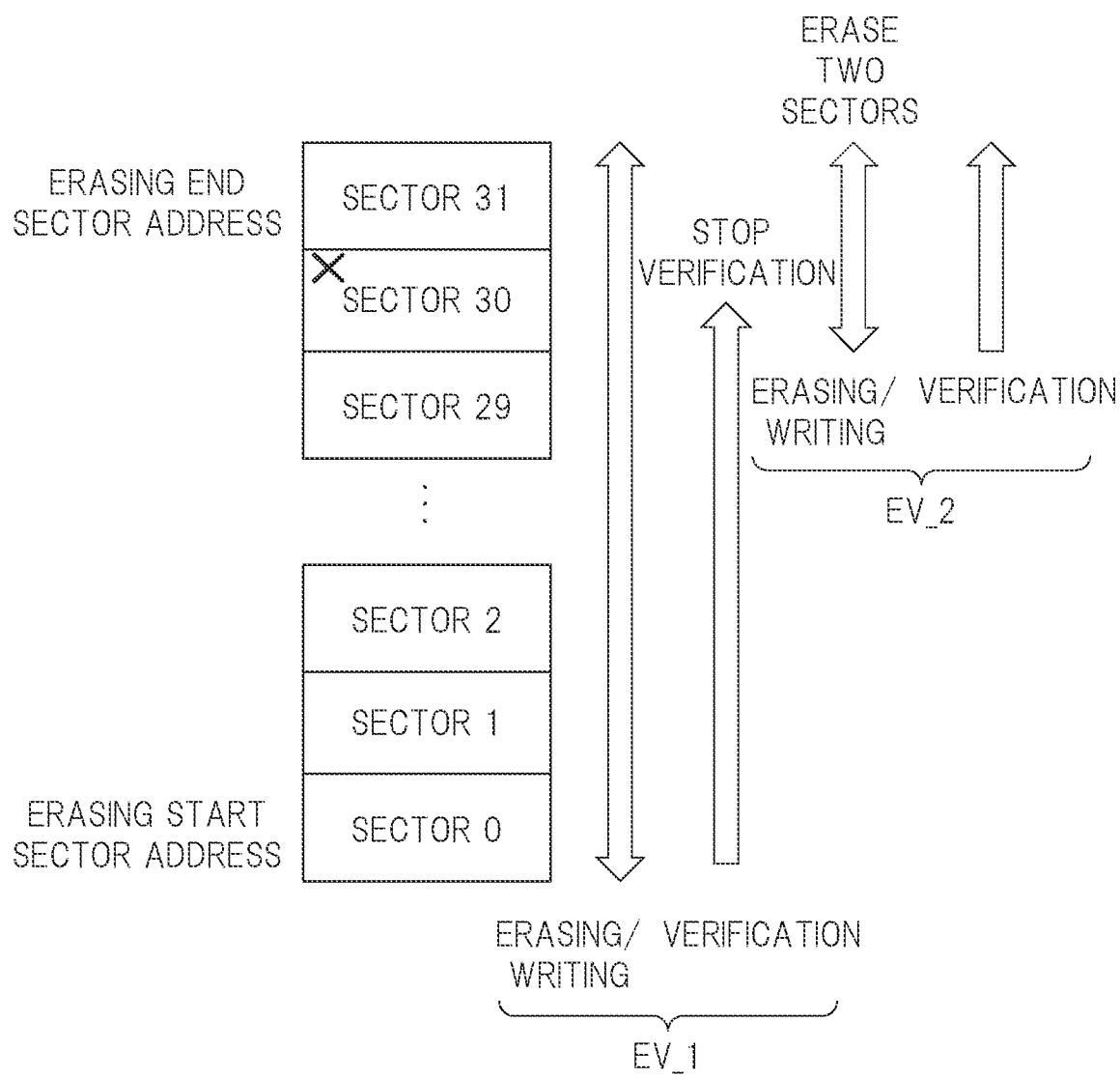
FIG. 8 is a view for schematically explaining the operation of the batch erasing according to the first embodiment.

When the process at Step S07 is completed, the processing flow returns to Step S03. An erasing range signal indicating the sectors 30 and 31, which is the reset erasing range, is supplies from the batch erasing range control circuit 6_1 to the address & mode control circuit 6_2. At Step S03, the address & mode control circuit 6_2 supplies an erasing command signal EIR for erasing the sectors 30 and 31 to the flash memory 5. Next, at Step S04, the address & mode control circuit 6_2 causes the flash memory 5 to execute a verification operation for the sectors 30 and 31. FIG. 8 schematically illustrates a state at this time. As a result, the erasing/writing operation is executed in a first round of erasing verification operation EV_1, but the erasing/writing operation and the verification operation are not executed for sectors in which erasing is succeeded in the verification operation. A second round of erasing verification operation EV_2 (including a step of re-erasing by the erasing/writing operation and a step of a verification operation) is executed for a range from the sector in which the erasing is failed to the sector specified by the erasing end sector address.

According to the first embodiment, even in a case where failure of erasing is confirmed by the verification operation, it is possible to prevent the erasing verification operation from being executed again for the sectors in which the erasing is succeeded. This makes it possible to suppress the erasing time from becoming long. Further, it is also possible to suppress the characteristics of the memory cell from being deteriorated.

Second Embodiment

In the first embodiment, the example in which the erasing time is suppressed from becoming long in a case where the erasing range reset at Step S07 illustrated in FIG. 3 is represented by the power of 2 has been described. In a second embodiment, a semiconductor device capable of suppressing an erasing time from becoming long in a case where a reset erasing range is not represented by a power of 2 is provided.

Figure 9:
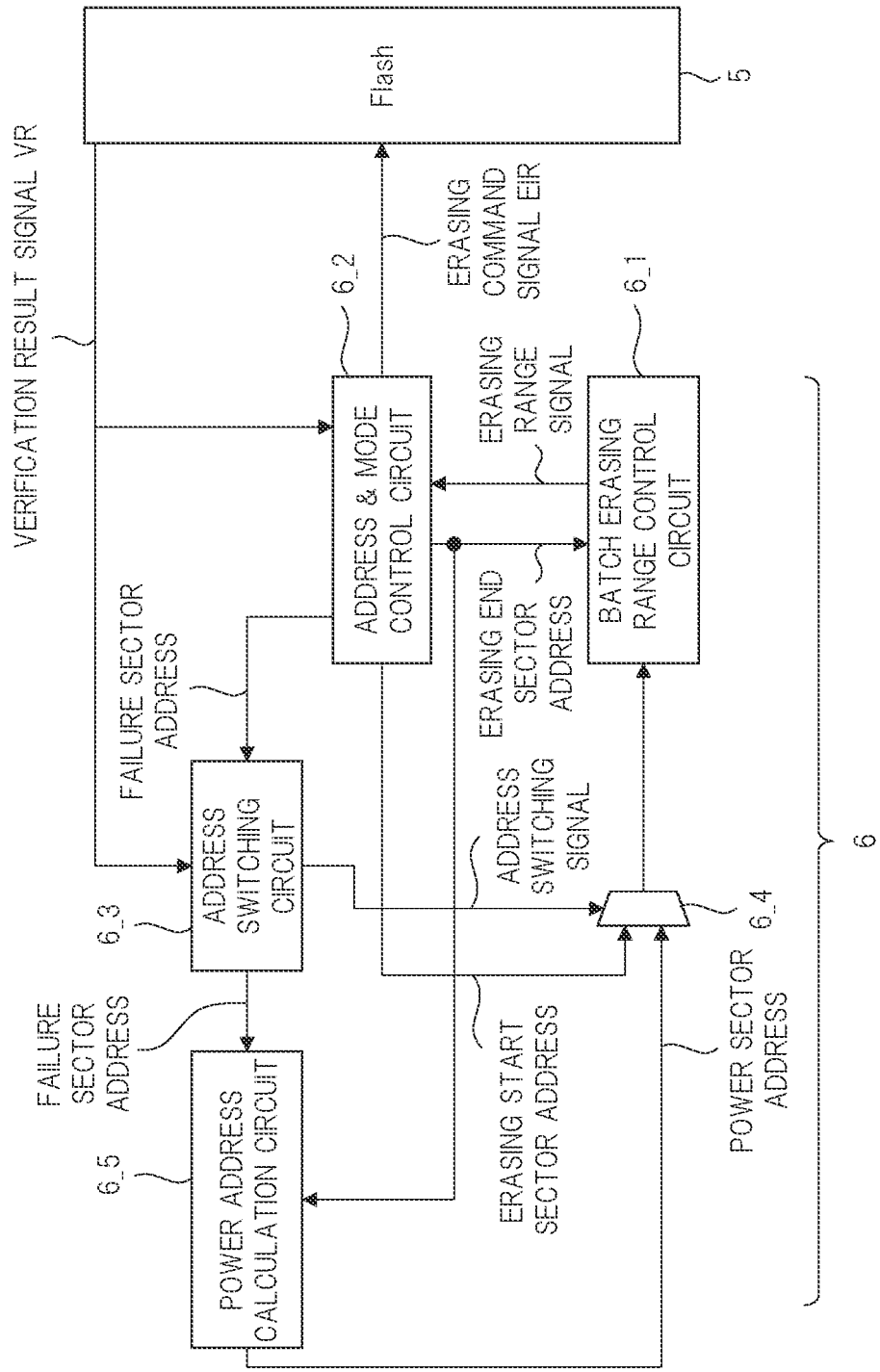
FIG. 9 is a block diagram illustrating a configuration of a control block according to a second embodiment.

FIG. 9 is a block diagram illustrating a configuration of a control block according to the second embodiment. FIG. 9 is similar to FIG. 2. A difference therebetween is that a power address calculation circuit 6_5 is added in FIG. 9. A failure sector address is supplied from an address switching circuit 6_3 to the power address calculation circuit 6_5. An erasing end sector address is supplied from an address & mode control circuit 6_2 to the power address calculation circuit 6_5. A power sector address calculated by the power address calculation circuit 6_5 is supplied to a selector 6_4 instead of the failure sector address.

Figure 10:
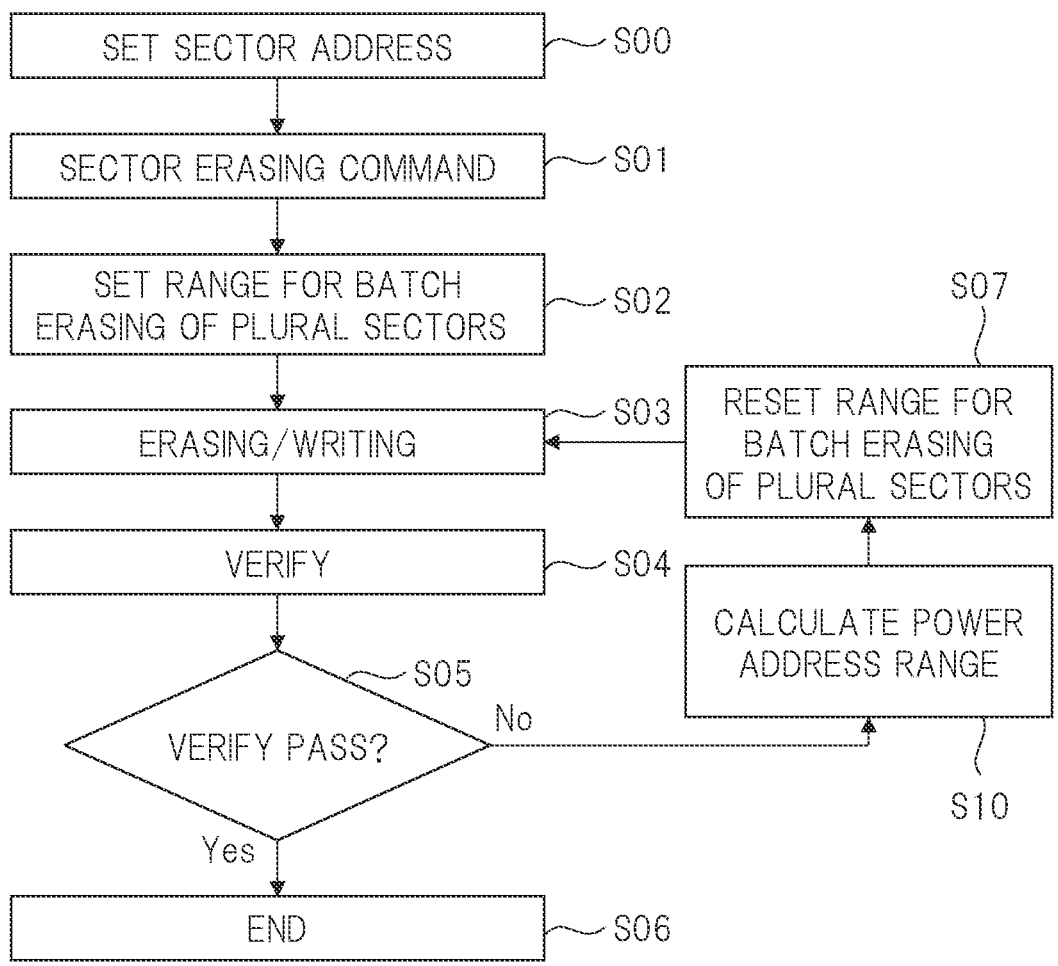
FIG. 10 is a flowchart diagram for explaining an operation of batch erasing according to the second embodiment.

FIG. 10 a flowchart diagram for explaining an operation of batch erasing according to the second embodiment. FIG. 10 is similar to FIG. 3. A difference therebetween is that Step S10 of power address range calculation of calculating a power address range is added in FIG. 10. In a case where a verification result signal VR indicates that erasing is failed at Step S05, a process at Step S10 is executed, and an erasing range calculated at Step S10 is set to a batch erasing range control circuit 6_1 at Step S07.

Figure 11:
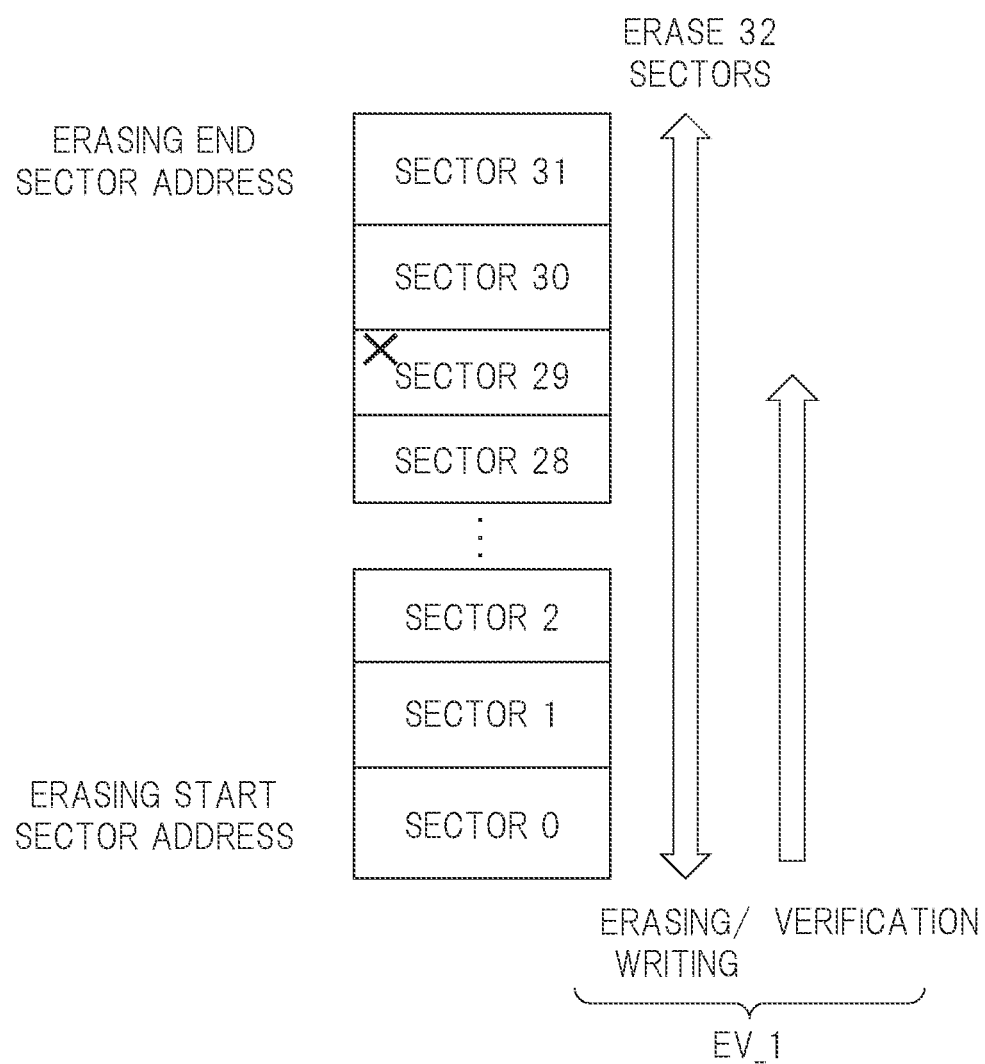
FIG. 11 is a view for schematically explaining the operation of the batch erasing according to the second embodiment.
Figure 12:
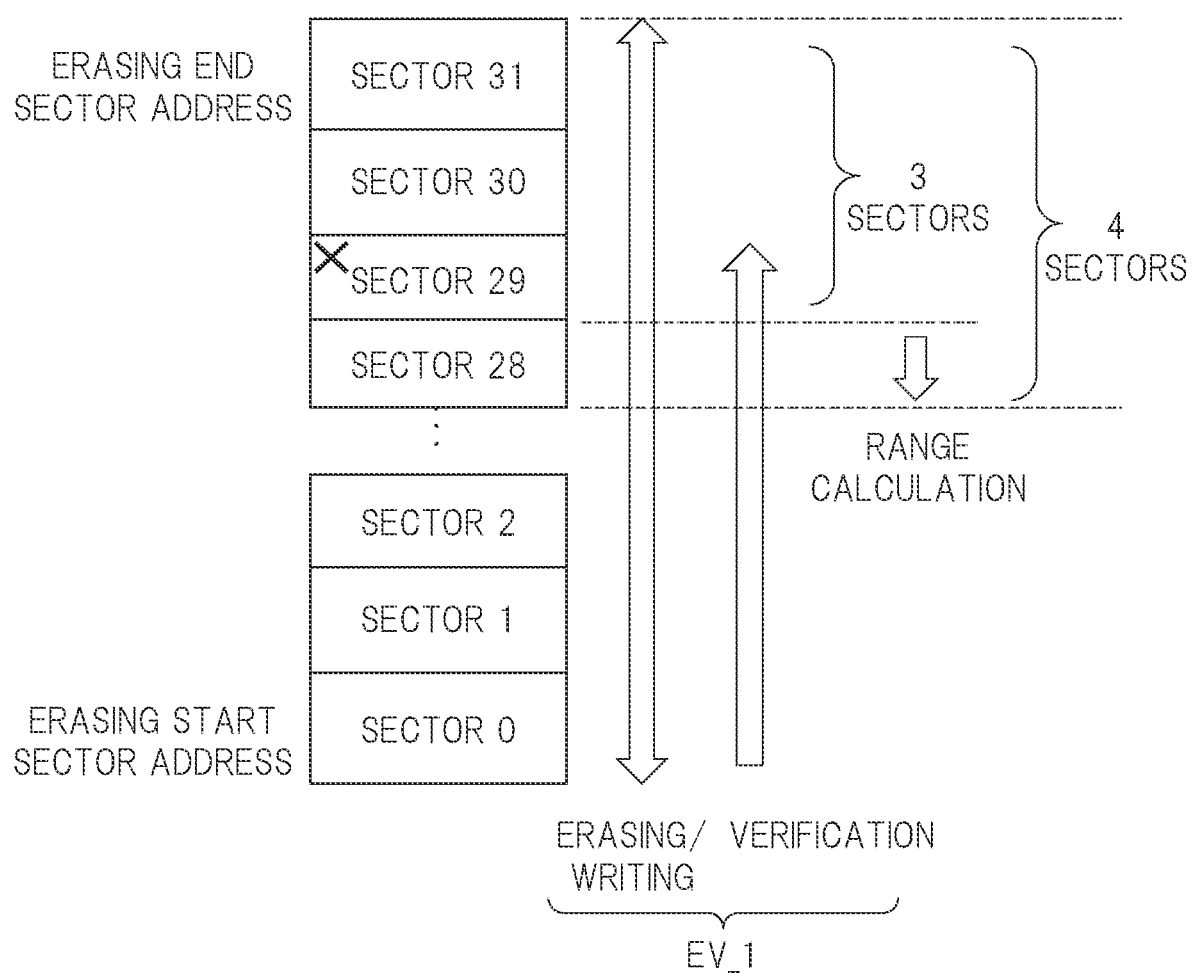
FIG. 12 is a view for schematically explaining the operation of the batch erasing according to the second embodiment.
Figure 13:
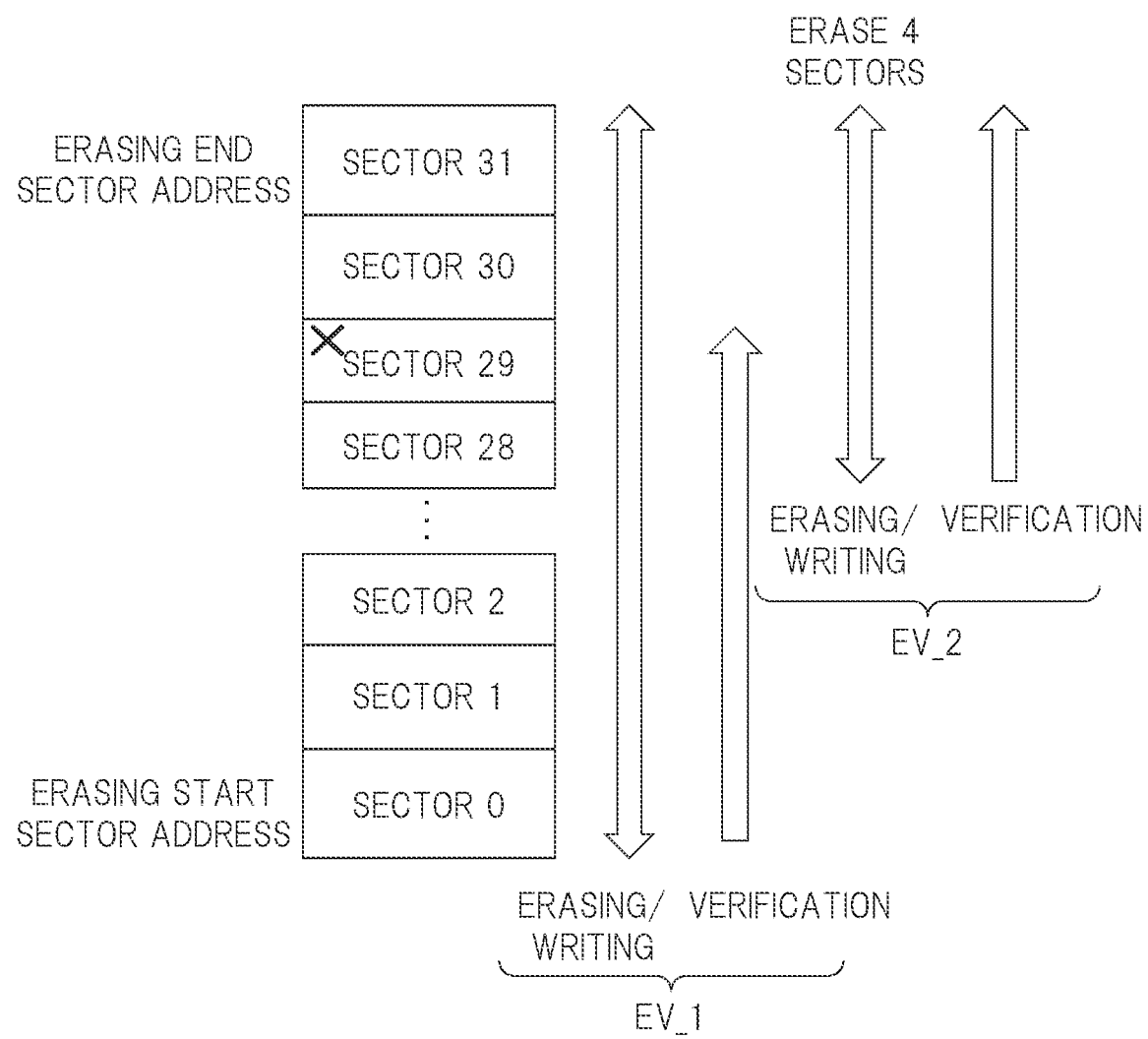
FIG. 13 is a view for schematically explaining the operation of the batch erasing according to the second embodiment.

FIG. 11 to FIG. 13 are views for schematically explaining the operation of the batch erasing according to the second embodiment.

As well as the first embodiment, a case where a batch erasing operation for batch erasing of sectors 0 to 31 in a flash memory 5 is instructed will be described. At Step S02 in FIG. 10, the sectors 0 to 31 is set to the batch erasing range control circuit 6_1 as the erasing range. At Step S03, an erasing/writing operation is executed for the 32 sectors (the sectors 0 to 31), and as illustrated in FIG. 11, the 32 sectors are erased.

It is assumed that a threshold value of a memory cell does not reach a predetermined value in the sector 29, and failure of erasing is notified by the verification result signal VR in the sector 29. In this case, as illustrated in FIG. 11, a verification operation for the sector 29 is stopped at Step S05. In this case, a range where the verification operation is not executed becomes three sectors, and the range cannot be represented by a power of 2.

In the second embodiment, the power address calculation circuit 6_5 calculates and outputs a power address for specifying a range that is a range including the failure sector address and becomes a power of 2 between the power address and the erasing end sector address. At this time, the power address calculation circuit 6_5 calculates the power sector address such that the range becomes the minimum range. FIG. 12 illustrates a case where the power sector address that includes the failure sector address and becomes the minimum range is calculated in range calculation by the power address calculation circuit 6_5. In this case, the power address calculation circuit 6_5 calculates the power sector address that specifies a range with four sectors including the sector 29, which is specified by the failure sector address, between the failure sector address and the erasing end sector address. Here, the power sector address is a sector address that specifies the sector 28.

At Step S07, the power sector address is supplied and set to the batch erasing range control circuit 6_1 via the selector 6_4. Then, the processes at Steps S03 to S05 are executed again. As a result, as illustrated in FIG. 13, in a second round of erasing verification operation EV_2, the erasing/writing operation and the verification operation are executed for the four sectors 28 to 31, the processing glow shifts to Step S06, and the batch erasing operation is terminated.

According to the second embodiment, the reset range can be represented by a power of 2, and this makes it possible to shorten the erasing time.

Third Embodiment

In a third embodiment, a semiconductor device configured to automatically switch between the configuration according to the first embodiment and the configuration according to the second embodiment in accordance with an erasing range to be reset to a batch erasing range control circuit 6_1, in other words, the number of sectors that remains because it is not determined that erasing is succeeded in a previous (for example, a first round of) erasing verification operation (hereinafter, referred to as "remaining sectors") is provided.

Figure 14:
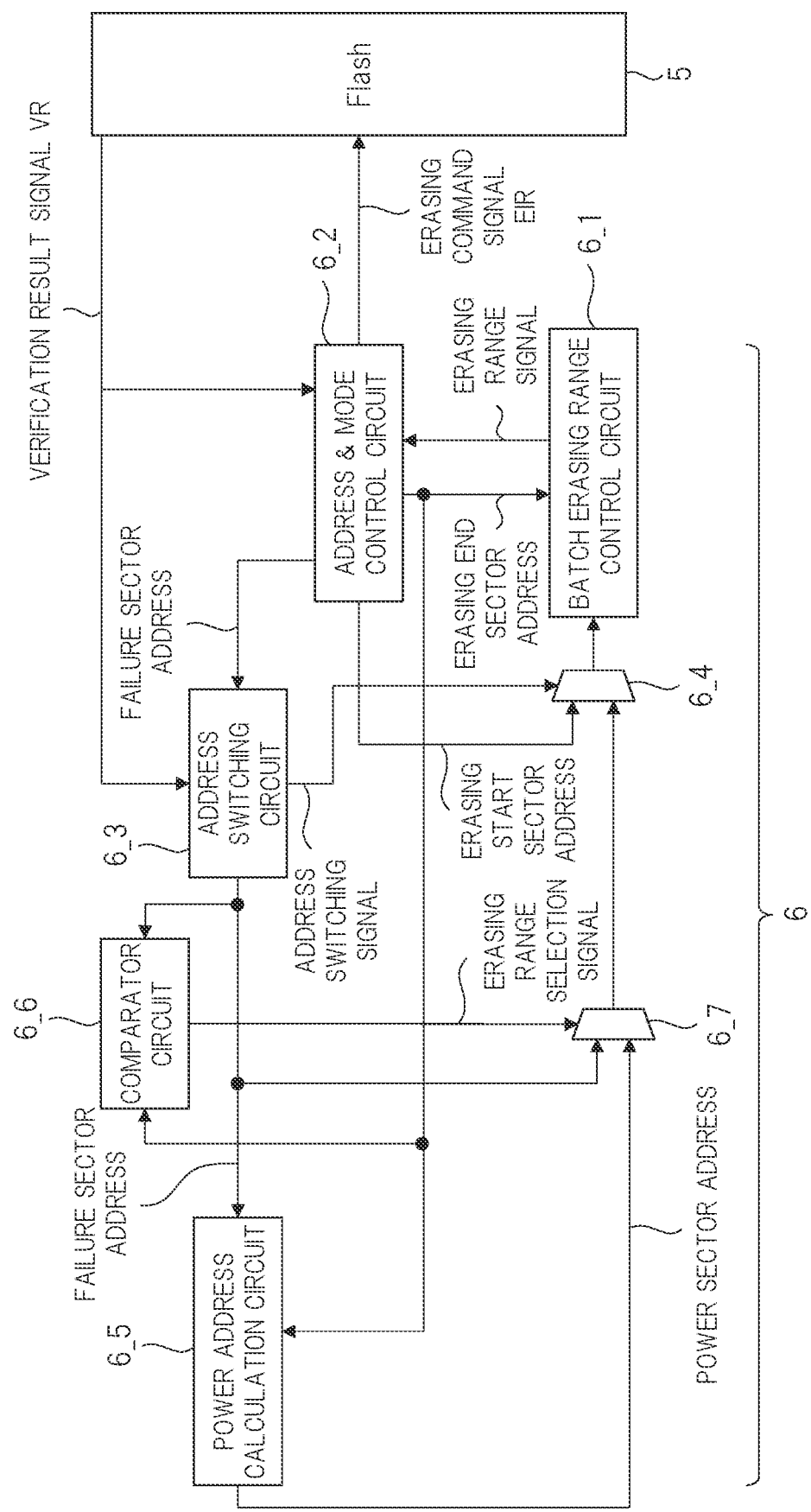
FIG. 14 is a block diagram illustrating a configuration of a control block according to a third embodiment.

FIG. 14 is a block diagram illustrating a configuration of a control block according to the third embodiment. FIG. 14 is similar to FIG. 9. A difference therebetween is that a comparator circuit 6_6 and a selector 6_7 are added in FIG. 14. The comparator circuit 6_6 compares a failure sector address outputted from an address switching circuit 6_3 with an erasing end sector address, and outputs a comparison result as an erasing range selection signal. The failure sector address from the address switching circuit 6_3 and a power sector address are supplied to the selector 6_7. The selector 6_7 selects the failure selector address or the power sector address in accordance with the erasing range selection signal, and supplies the selected one to a selector 6_4 instead of the power sector address.

The selector 6_4 and the selector 6_7 may be regarded as one selector in total. In this case, the selector regard as one is controlled by a selection signal from the address switching circuit 6_3 and the erasing range selection signal from the comparator circuit 6_6. Namely, this selector is controlled by a verification result signal VR and a comparison result by the comparator circuit 6_6.

Figure 15:
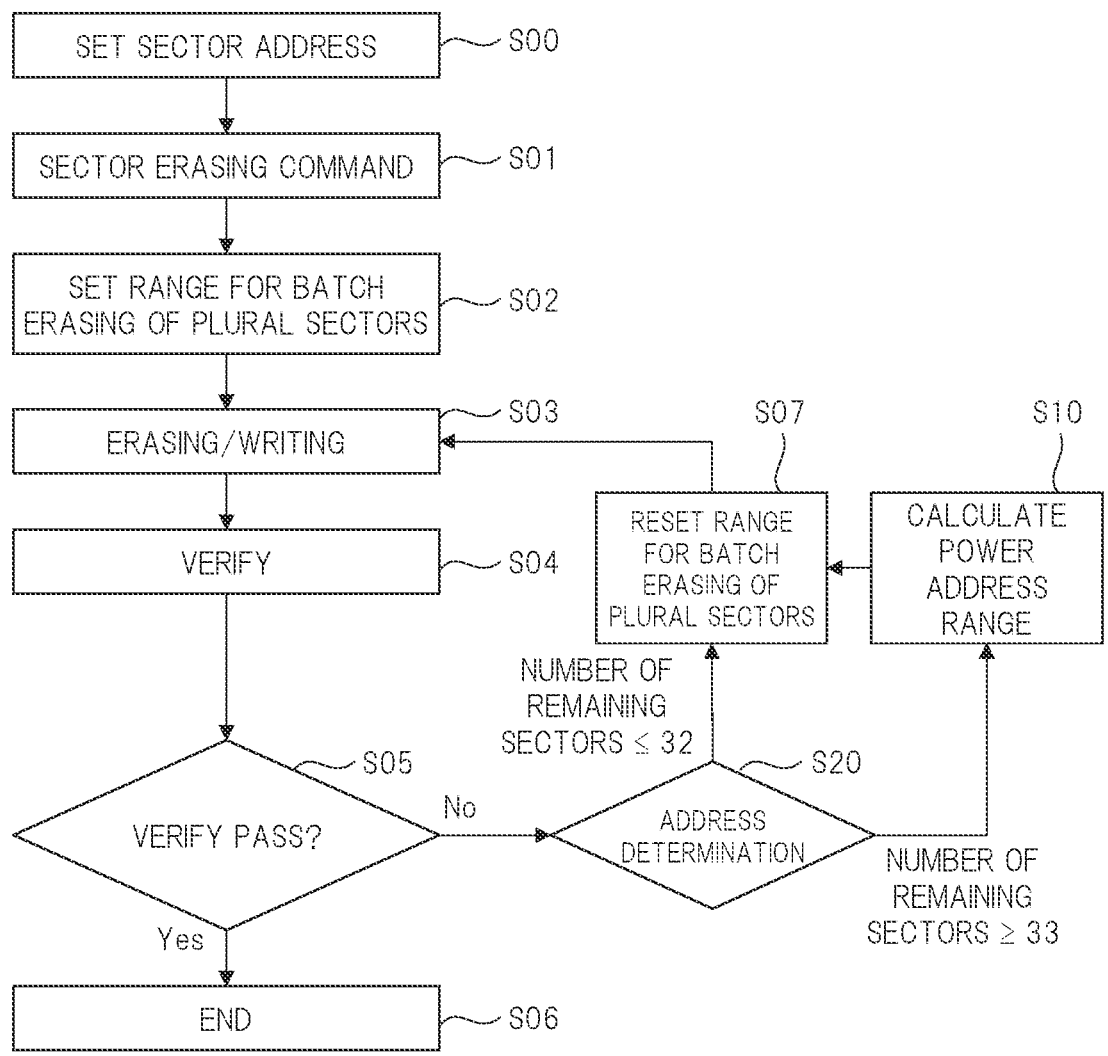
FIG. 15 is a flowchart diagram for explaining an operation of batch erasing according to the third embodiment.

FIG. 15 is a flowchart diagram for explaining an operation of batch erasing according to the third embodiment. FIG. 15 is similar to FIG. 10. A difference therebetween is that Step S20 at which address determination is executed is added to FIG. 15. At Step S05, in a case where a verification operation is stopped, it is determined at Step S20 whether the number of remaining sectors is a predetermined value (that is, a number threshold value) or more or not. In a case where it is determined that the number of remaining sectors is the number threshold value or more, a process at Step S10 is executed next. In a case where it is determined that the number of remaining sectors is less than the number threshold value, a process at Step S07 is executed.

Figure 16:
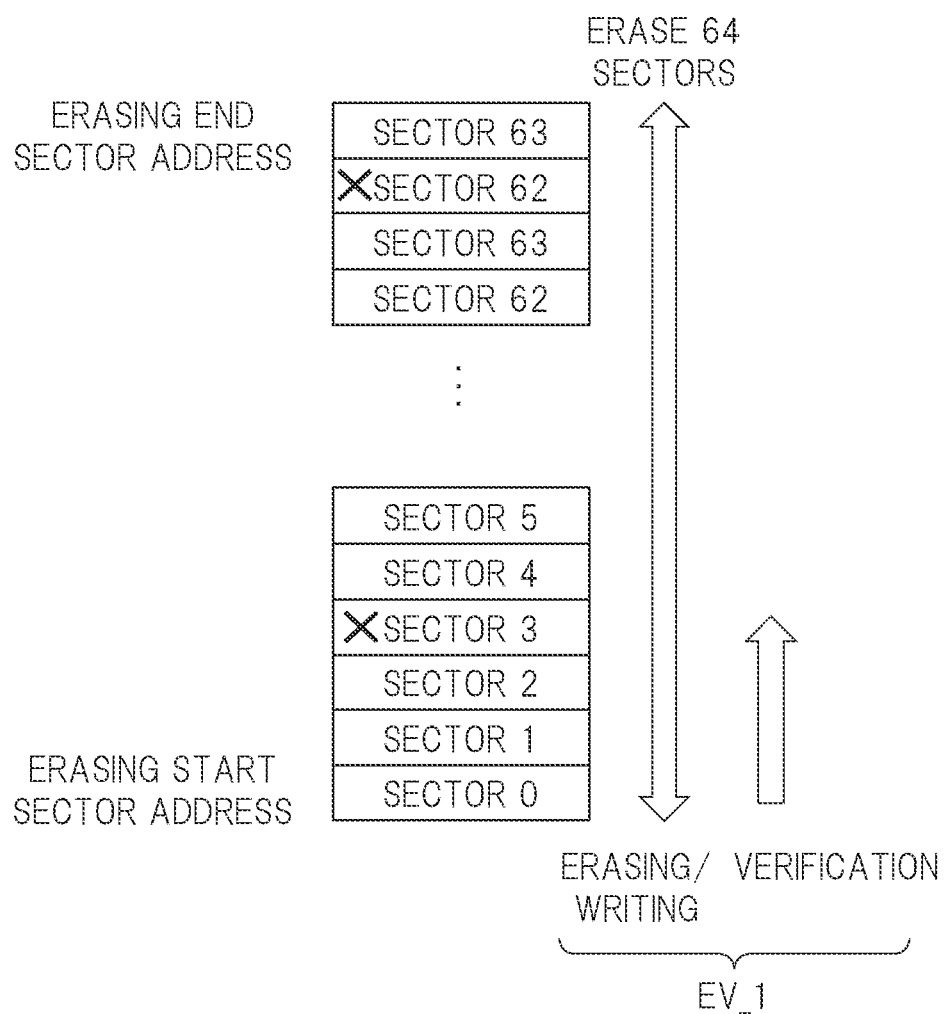
FIG. 16 is a view for schematically explaining the operation of the batch erasing according to the third embodiment.

FIG. 16 to FIG. 20 are views for schematically explaining the operation of the batch erasing according to the third embodiment. Here, as illustrated in FIG. 16, a case where batch erasing for 64 sectors (sectors 0 to 63) as an erasing range is executed will be described. Further, a case where it is determined that erasing is failed in the sector 3 will first be described, and a case where it is determined that erasing is failed in the sector 62 will be described next.

Figure 17:
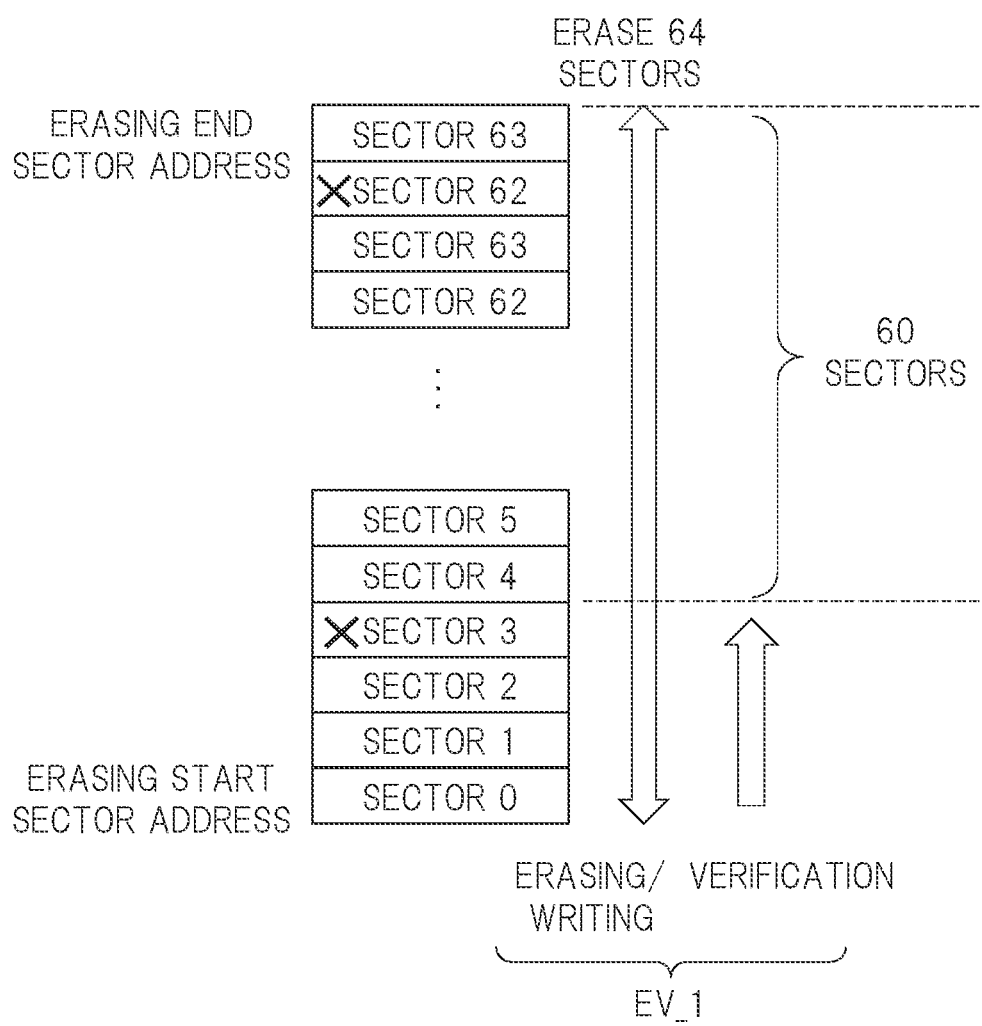
FIG. 17 is a view for schematically explaining the operation of the batch erasing according to the third embodiment.

First, at Step S03, 64 sectors are erased. In a case where it is determined that erasing is failed in the sector 3, as illustrated in FIG. 17, a verification operation is stopped in the sector 3, and a failure sector address that specifies the sector 3 is outputted from the address switching circuit 6_3.

At Step S20, the comparator circuit 6_6 calculates a difference between the failure sector address (the sector 3) and an erasing end sector address (the sector 63), calculates that the number of remaining sectors is 60, and compares the calculated number of sectors and the number threshold value. Here, a case where the number threshold value is 33 will be described as an example.

Figure 18:
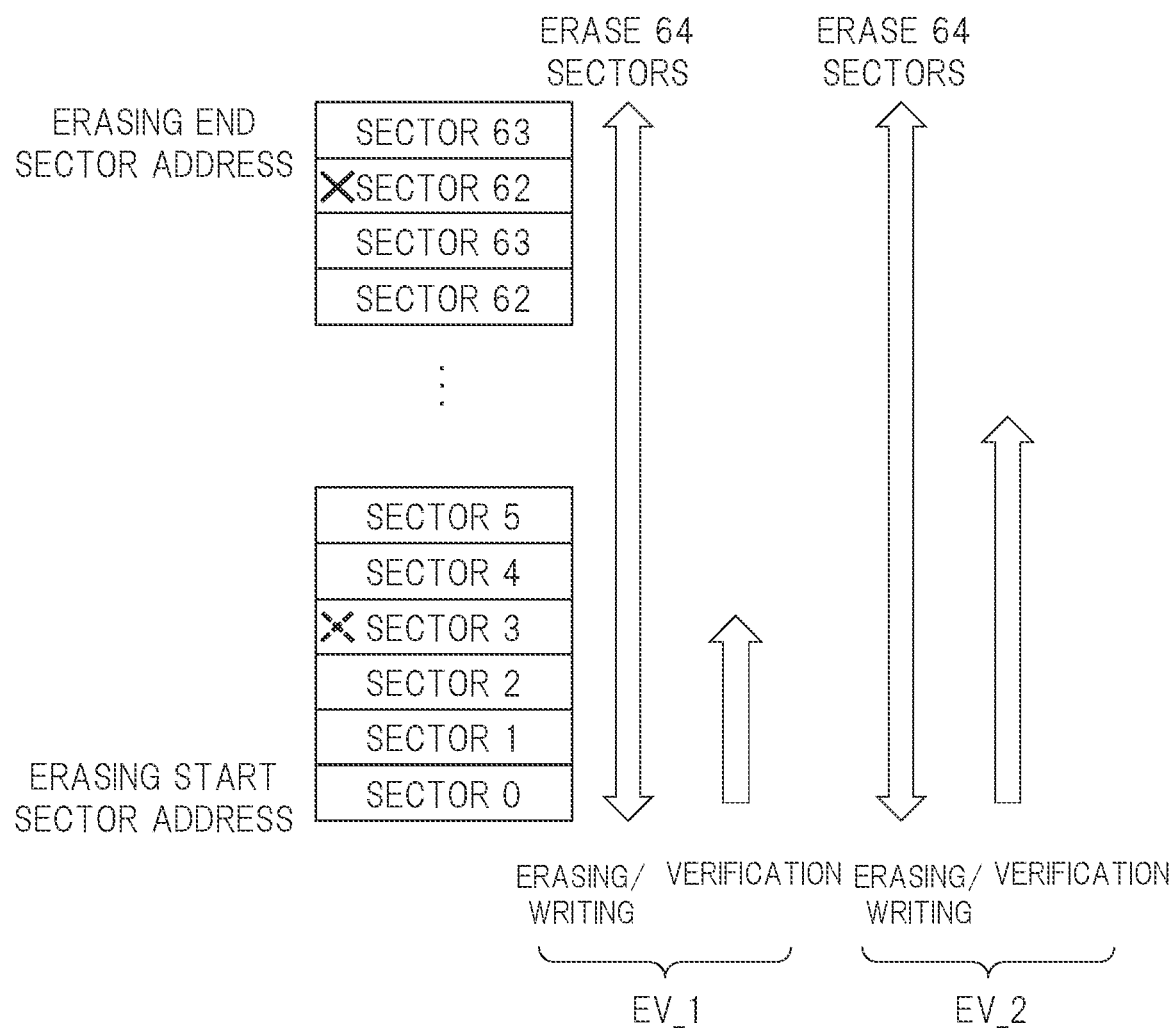
FIG. 18 is a view for schematically explaining the operation of the batch erasing according to the third embodiment.

Since the number of remaining sectors is 33 or more, a process at Step S10 is executed next. Further, in this case, the comparator circuit 6_6 instructs the selector 6_7 to select a power sector address by an erasing range selection signal. At Step S10, as described in the second embodiment, the power sector address is calculated. The calculated power sector address is supplied to the batch erasing range control circuit 6_1 via the selectors 6_7 and 6_4. As a result, at Step S07, an erasing range specified by the power sector address and the erasing end sector address is reset to the batch erasing range control circuit 6_1. In this case, the power sector address specifies the sector 0, as illustrated in FIG. 18, the erasing range becomes a range from the sector 0 to the sector 63. Namely, as illustrated in FIG. 18, a second round of erasing verification operation EV_2 is executed for the sectors 0 to 63.

Figure 19:
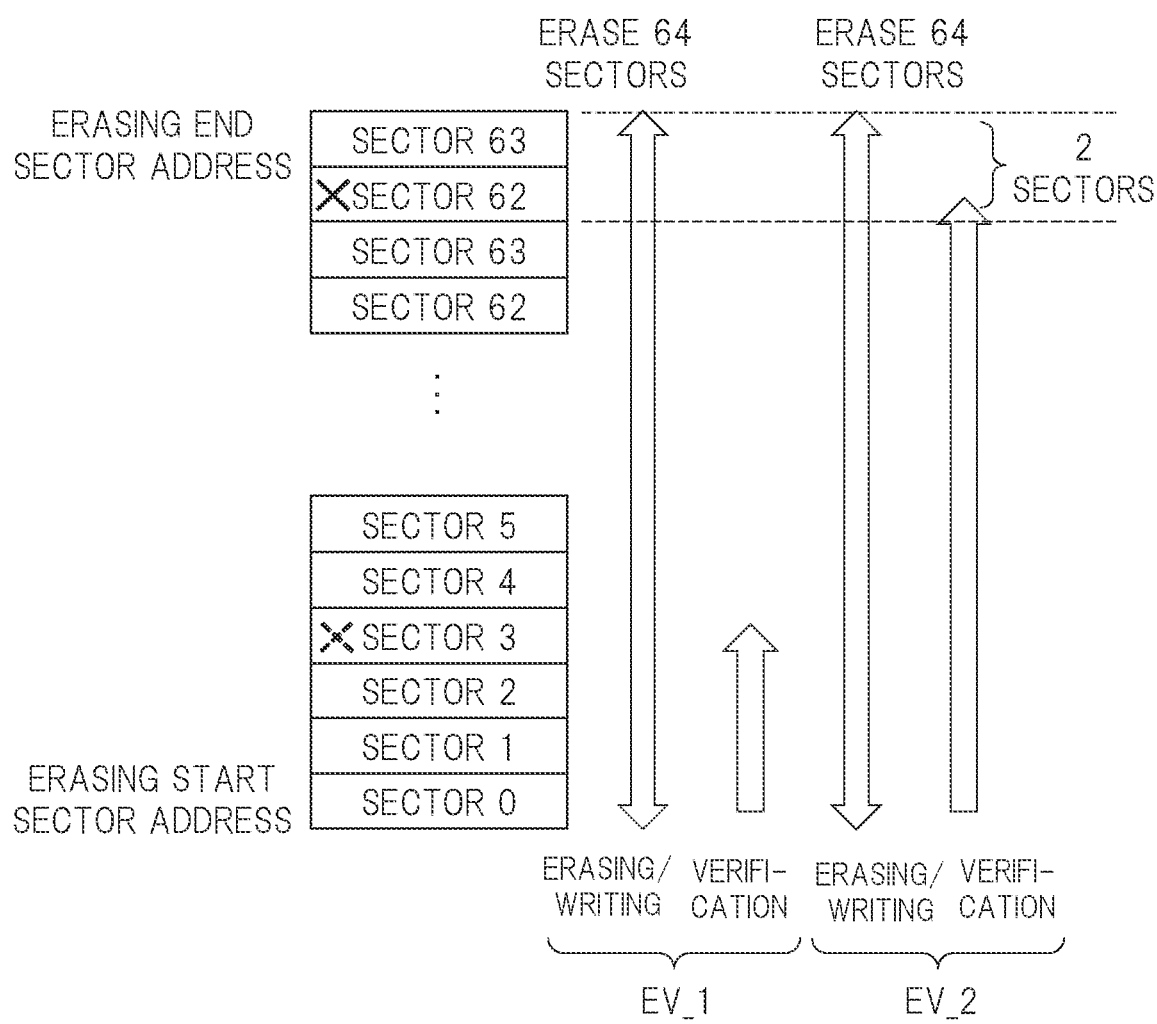
FIG. 19 is a view for schematically explaining the operation of the batch erasing according to the third embodiment.

When in the second round of erasing verification operation EV_2, it is determined that erasing is succeeded in the sector 3 and this time, it is determined that erasing is failed in the sector 62, as illustrated in FIG. 19, the verification operation is stopped at Step S05 in the second round of erasing verification operation EV_2, and a failure sector address that specifies the sector 62 is outputted from the address switching circuit 6_3. By calculating remaining sectors in the comparator circuit 6_6, it is calculated that the number of remaining sectors is two, and it is determined that the number of remaining sectors is less than 33 (32 or less). In accordance with this determination, the comparator circuit 6_6 controls, by an erasing range selection signal, the selector 67 to select the failure sector address outputted from the address switching circuit 6_3.

Figure 20:
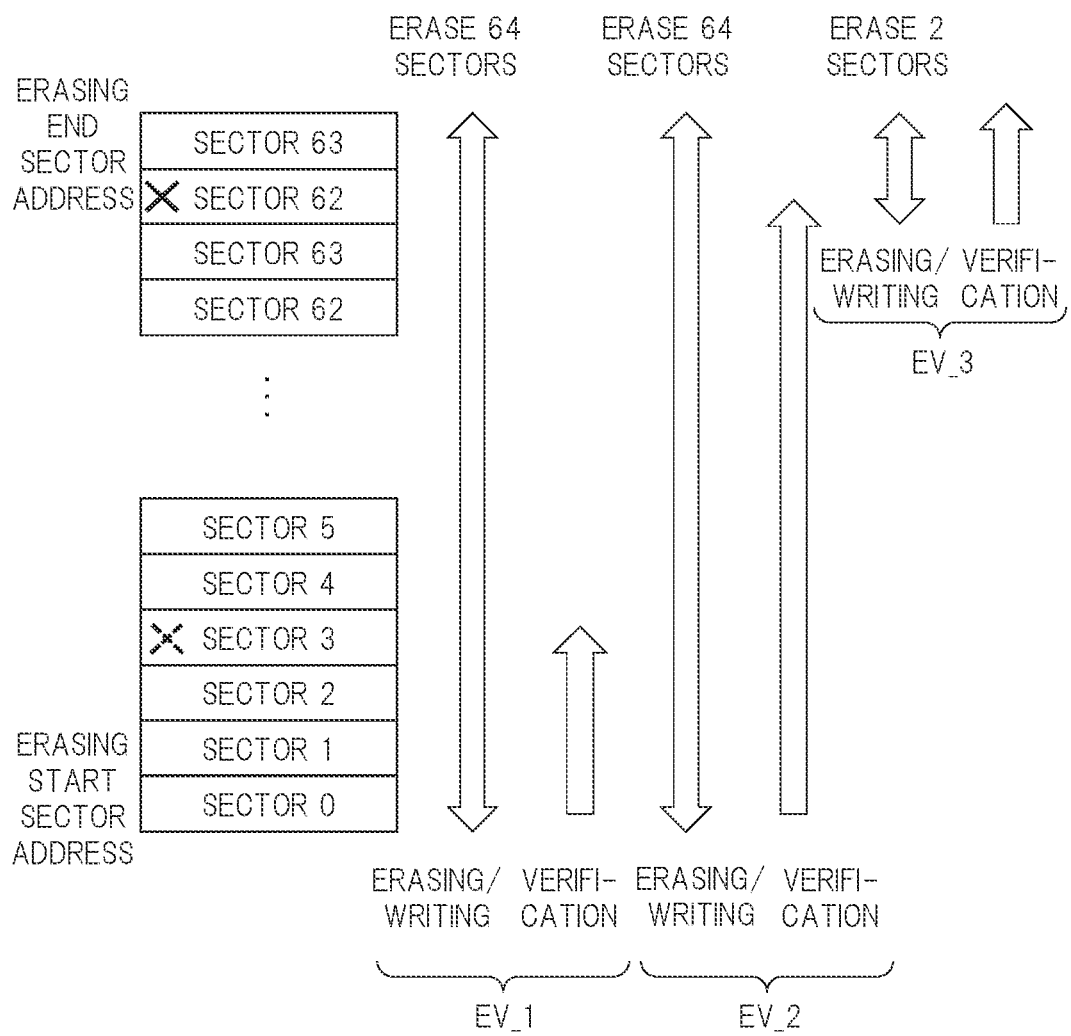
FIG. 20 is a view for schematically explaining the operation of the batch erasing according to the third embodiment.

Thus, the failure sector address is supplied to the batch erasing range control circuit 6_1 instead of the power sector address, and an erasing range indicated by the failure sector address and the erasing end sector address is reset. As a result, as illustrated in FIG. 20, a third round of erasing verification operation EV_3 is executed, and in the third round of erasing verification operation EV_3, the erasing/writing operation and the verification operation are executed for the remaining sectors 62 and 63.

According to the third embodiment, it is possible to automatically select between the configuration described in the first embodiment and the configuration described in the second embodiment by using the number threshold value as a boundary. According to the first embodiment, compared with the case where the power sector address is used, it is possible to set the erasing range to the minimum range, and this makes it possible to suppress characteristics of a memory cell from being deteriorated. On the other hand, according to the second embodiment, since the erasing range is specified by the power sector address, it is possible to minimize an erasing time.

As described above, the invention made by the inventor(s) of the present application has been described specifically on the basis of the embodiments. However, the present invention is not limited to the embodiments described above, and it goes without saying that the present invention may be modified into various forms without departing from the substance thereof. For example, when the verification result signal VR indicates failure of erasing, the address & mode control circuit 6_2 outputs the failure sector address. However, in such a case, the address & mode control circuit 6_2 may output a failure address that directly specifies the memory cell in which the erasing is failed. In this case, for example, the address switching circuit 6_3 converts the failure address into a failure sector address including it, and outputs the failure sector address.

What is claimed is:

1. A semiconductor device comprising:
a memory provided with a plurality of electrically erasable memory cells and configured to output a verification result signal indicating whether erasing is succeeded or not; and
a control block configured to control the memory,
wherein the control block includes a batch erasing range control circuit indicating a range to be collectively erased in the memory,
wherein when the verification result signal indicates failure of erasing of sectors in a first range specified by the batch erasing range control circuit after the erasing is executed, a second range for which erasing is to be executed again is specified on a basis of a failure sector address that specifies a sector for which the erasing is failed and an end sector address that specifies an end of the first range, and the specified second range is set to the batch erasing range control circuit, and erasing sectors in the second range is executed,
wherein the control block includes:
a first selector configured to supply a start sector address that specifies a start of the first range and the failure sector address; and
a switching circuit configured to output a selection signal for controlling selection by the first selector on a basis of the verification result signal, and
wherein the control block includes:
a power address calculation circuit configured to calculate sector addresses, which include the sector for which the erasing is failed and indicate a collectively erasable power-of-two range, on a basis of the end sector address and the failure sector address and supply the calculated sector addresses to the first selector; and
a comparator circuit configured to determine a number of sectors, for which confirmation of whether erasing is succeeded or not has not been executed, on the basis of the failure sector address and the end sector address, and compare the number of sectors with a number threshold value; and
a second selector configured to select a sector address in accordance with the verification result signal and a determination result of the comparator circuit.

2. A semiconductor device comprising:
a memory provided with a plurality of electrically erasable memory cells and configured to output a verification result signal indicating whether erasing is succeeded or not; and
a control block configured to control the memory,
wherein the control block includes a batch erasing range control circuit indicating a range to be collectively erased in the memory,
wherein when the verification result signal indicates failure of erasing of sectors in a first range specified by the batch erasing range control circuit after the erasing is executed, a second range for which erasing is to be executed again is specified on a basis of a failure sector address that specifies a sector for which the erasing is failed and an end sector address that specifies an end of the first range, and the specified second range is set to the batch erasing range control circuit, and erasing sectors in the second range is executed, and
wherein the control block includes:
a power address calculation circuit configured to calculate sector addresses, which include the sector for which the erasing is failed, indicate a collectively erasable power-of-two range based on the end sector address and the failure sector address, and supply the calculated sector addresses to the first selector; and
a comparator circuit configured to determine a number of sectors, for which confirmation of whether erasing is succeeded or not has not been executed, on the basis of the failure sector address and the end sector address, and compare the number of sectors with a number threshold value; and
a second selector configured to select a sector address in accordance with the verification result signal and a determination result of the comparator circuit.

* * * * *